United States Patent [19]
Silver et al.

[11] Patent Number: 5,790,882
[45] Date of Patent: Aug. 4, 1998

[54] PROGRAMMABLE LOGIC DEVICE PLACEMENT METHOD UTILIZING WEIGHTING FUNCTION TO FACILITATE PIN LOCKING

[75] Inventors: Joshua M. Silver, Sunnyvale; David A. Harrison, Cupertino; Hua Xue, Sunnyvale, all of Calif.

[73] Assignee: Xilinx, Inc., San Jose, Calif.

[21] Appl. No.: 746,656

[22] Filed: Nov. 13, 1996

[51] Int. Cl.⁶ .................................................. G06F 3/00
[52] U.S. Cl. .................. 395/800.37; 395/376; 395/562; 395/564; 395/800.32; 395/800.33; 395/800.37; 395/800.39; 395/800.42; 395/800.43; 364/718; 364/735; 364/750.5
[58] Field of Search .................. 395/800.33, 800.42, 395/800.37, 800.32, 800.39, 800.43, 376, 562, 564; 364/258, 244.9, 246.3, 718, 735, 750.5, DIG. 1

[56] References Cited

U.S. PATENT DOCUMENTS

| | | | |
|---|---|---|---|
| 5,349,691 | 9/1994 | Harrison et al. | 395/800 |
| 5,450,608 | 9/1995 | Steele | 395/800 |
| 5,636,368 | 6/1997 | Harrison et al. | 395/500 |
| 5,689,686 | 11/1997 | Nazarian et al. | 395/500 |

OTHER PUBLICATIONS

Xilinx Programmable Gate Array Data Book, pp. 3–1 through 3–67, 1996, available from Xilinx, Inc. 2100 Logic Drive, San Jose, CA 95124.

C. M. Fiduccia, R. M. Mattheyses, "A Linear–Time Heuristic for Improving Network Partitions", Paper 13.1, pp. 175–181, 19th Design Automation Conference, 1982.

Zafar Hasan, David Harrison, Maciei Ciesielski, "A Fast Partitioning Method for PLA–Based FPGAs", pp. 34–39, IEEE Design & Test of Computers, 1992.

*Primary Examiner*—Larry D. Donaghue
*Assistant Examiner*—Dzung C. Nguyen
*Attorney, Agent, or Firm*—Patrick T. Bever; Jeanette S. Harms

[57] ABSTRACT

A method for placing a logic function into the function blocks of a complex programmable logic device (CPLD) to maintain the same input/output pin locations after the logic function is subsequently modified by a user. The method utilizes a weighting function to assign portions of the logic function to the function blocks such that sufficient resources are available in each function block to implement subsequent modifications to the logic function without changing the originally-assigned input and output pin locations. For each portion of the logic function, the weighting function is employed to identify the function block which implements the portion while maximizing the available resources in all of the function blocks. If a particular equation cannot be placed, the method utilizes a corrective measure such as fitting refinement, buffering and logic reformation to place the equation. If the equation still cannot be placed, the weighting function is altered, thereby changing the criteria by which logic portions are assigned to the function blocks. The placement method is then repeated with the altered weighting function.

11 Claims, 16 Drawing Sheets

XC9500 ARCHITECTURE

XC9500 FUNCTION BLOCK

XC9500 MACROCELL WITHIN FUNCTION BLOCK

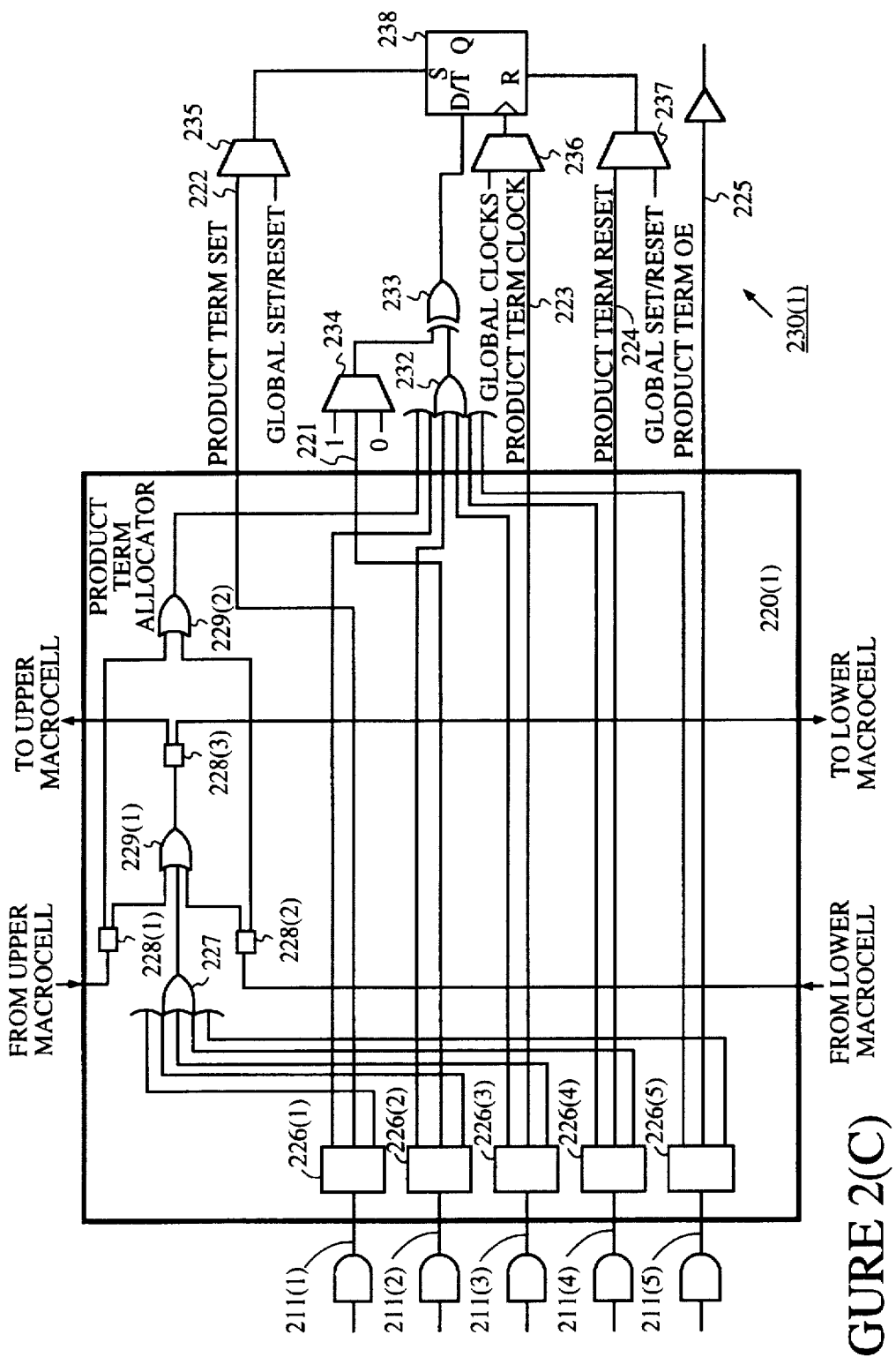
FIGURE 2(C)  PRODUCT TERM ALLOCATOR LOGIC

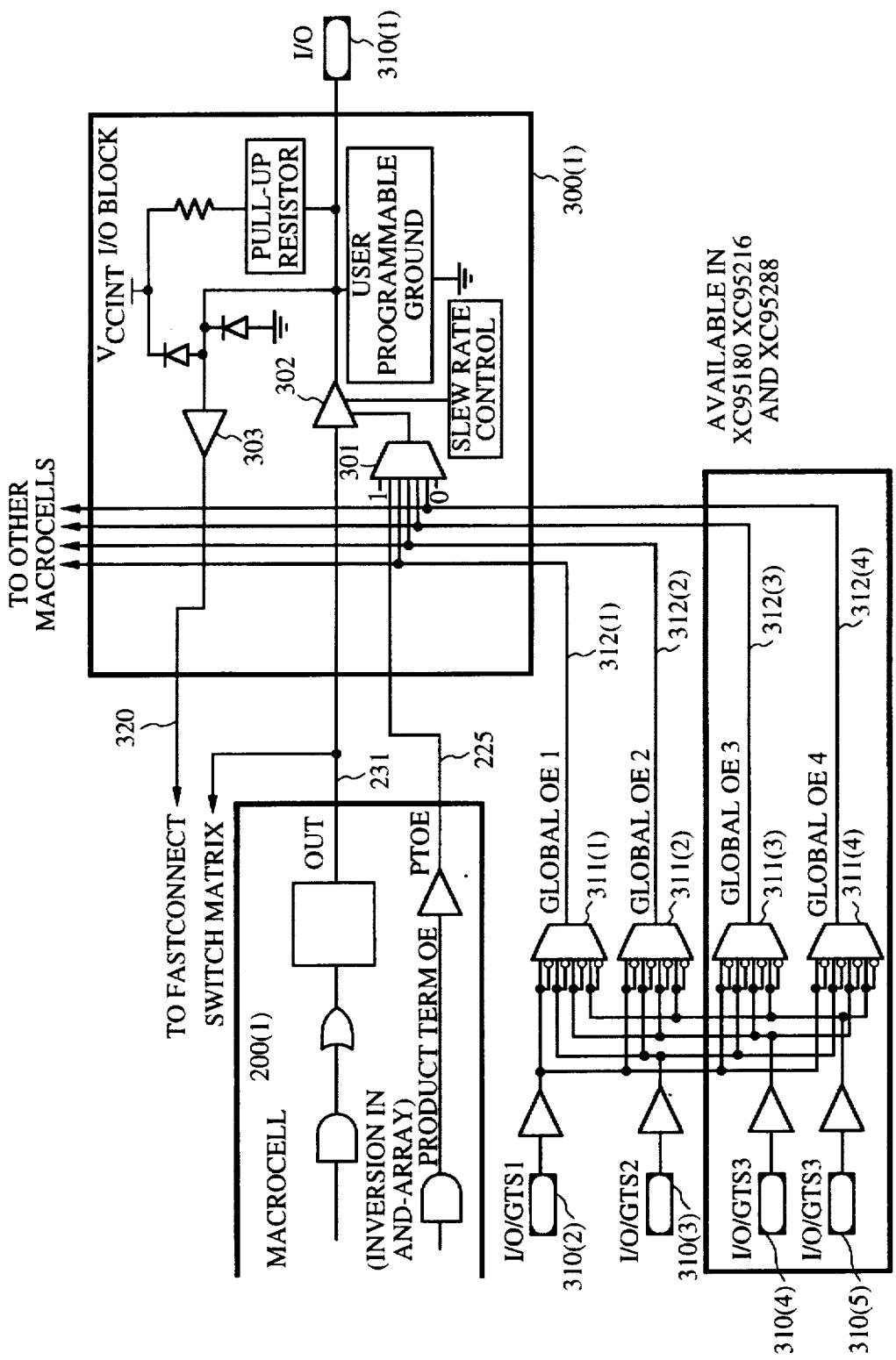
FIGURE 3 I/O BLOCK AND OUTPUT ENABLE CAPABILITY

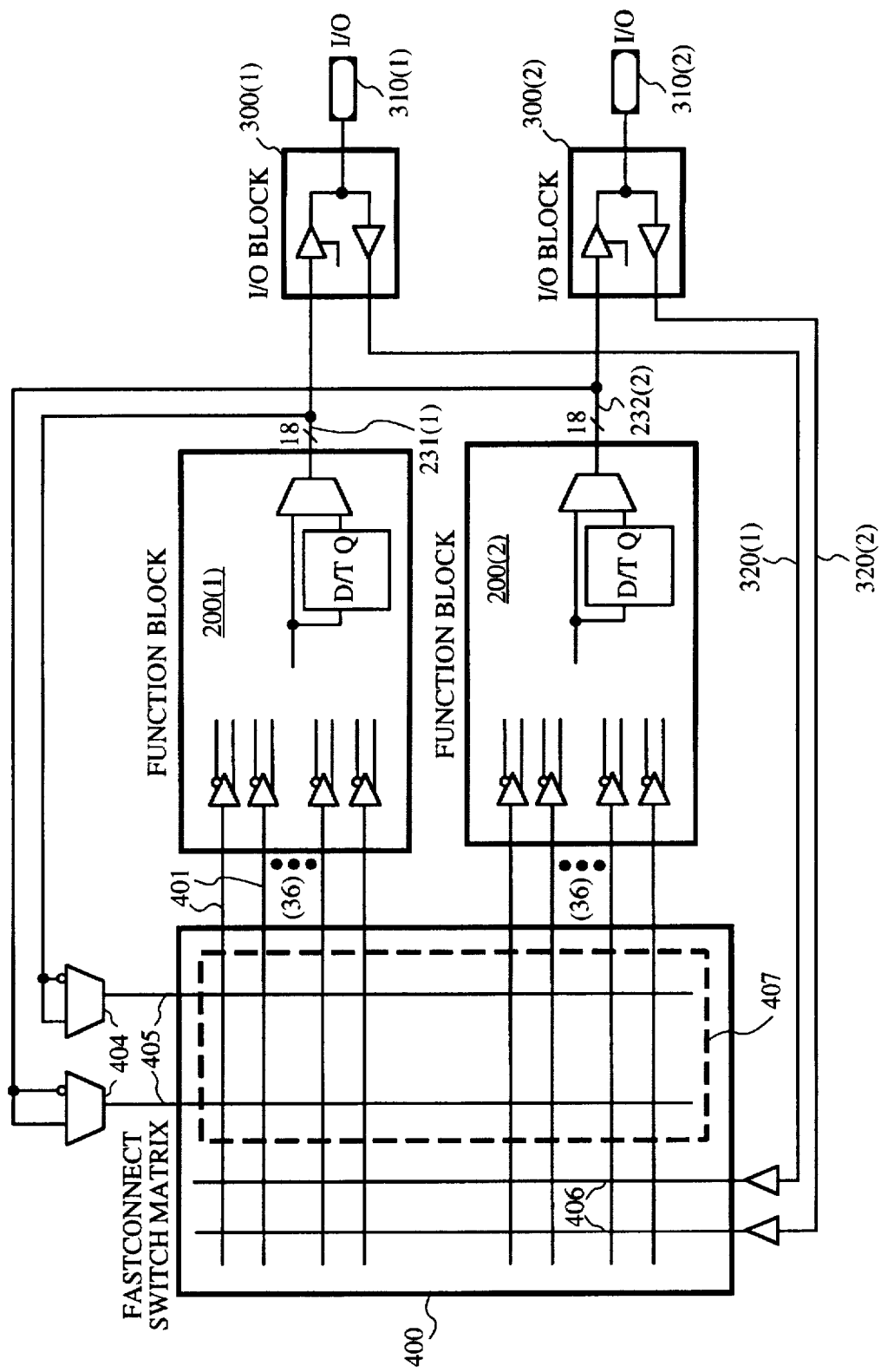
FIGURE 4 FASTCONNECT SWITCH MATRIX

PROGRAMMABLE LOGIC DEVICE PLACEMENT METHOD UTILIZING WEIGHTING FUNCTION TO FACILITATE PIN LOCKING

BACKGROUND OF THE INVENTION

1. Field of the Invention

The present invention relates to programmable logic devices, and more specifically to a method for placing a logic function in a programmable logic device such that input/output pin location changes are minimized when the logic function is subsequently modified.

2. Background Art

Programmable logic devices (PLDs) are a class of integrated circuits (ICs) which can be programmed by a user to emulate various logic functions. Logic designers typically use PLDs to implement control logic in electronic systems because they are relatively easy to program, and often can be reprogrammed to update the emulated logic function. This makes their use in an electronic system's design phase less costly than custom hardwired or "application specific" integrated circuits (ASICs).

One major class of PLDs includes a set of input pins, a programmable AND plane connected to the input pins, an OR plane connected to outputs of the AND plane and a set of output pins connected to outputs of the OR plane. The AND plane provides a matrix of programmable connections where each column connects to an input pin and each row forms an output of the AND plane, called a product term (P-term) element, which is transmitted to the OR plane. The OR plane may be programmable such that each P-term element is connectable to columns leading to different output pins, in which case the PLD is called a programmable logic array (PLA). Alternatively, the OR plane may be fixed such that each P-term element is assigned to a particular output pin, in which case the PLD is called a programmable array logic (PAL) device.

PLAs and PALs contain two levels of logic (AND and OR) and are capable of implementing logic functions that are representable in "sum-of-products" form. The sum-of-products form of a logic function includes a set of P-terms which are collectively "ORed" together to produce the function's output signal. Such a logic function is represented in a PLD by programmed connections in the AND plane and OR plane. Each P-term element has a programmable input connection in the AND plane to each input pin and produces a single output value representing the logical AND or "product" of the connected inputs. Usually, both the original input pin value and its complement are available for connection to a P-term element. Each output has a programmable P-term element connection in the OR plane and produces an output value representing the logical OR or "sum" of the connected P-term elements.

These early PLDs were well-received by logic designers. However, as logic functions grew increasingly larger and more complex, logic designers were required to wire together two or more small PLDs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as complex programmable logic devices (CPLDs), includes two or more "function blocks" connected together and to input/output (I/O) resources by an interconnect matrix such that each of the function blocks communicates with other function blocks of the CPLD through the interconnect matrix. Each function block of the CPLD is structured like the two-level PLDs, described above, in that each function block includes an AND array having a number of P-term elements which are programmably connectable to a set of OR gates. In effect, these CPLDs incorporate several early PLDs and associated connection circuitry onto a single integrated circuit. This provides a circuit designer the convenience of implementing a complex logic function using a single IC.

CPLDs are programmed to implement complex logic functions using special programming processes.

Typically, known programming processes begin by optimizing (dividing) the complex logic function into smaller portions which are referred to herein as "equations". Each equation is expressed as a number of P-terms which, when ORed together, generate a sum-of-products term which represents a portion of the complex logic function. These equations are generally categorized as output equations (whose sum-of-products term is applied to an output pin of the CPLD package) and node equations (whose sum-of-products term is fed back into the interconnect matrix for use as an input for a subsequent equation).

The known programming process then partitions and places (assigns) the equations in the target CPLD by assigning a group of equations to each function block, and assigning each equation of the group to a specific part of the function block. This placement process also sets the output location of each equation such that, for example, each output equation is assigned to a specific output pin of the target CPLD.

Next, the programming process "maps" (assigns) each P-term of the group of equations to a specific P-term element of the function block.

Finally, after a final placement arrangement is determined for the complex logic function using the optimizing, partitioning, placing and mapping processes, the final placement arrangement is converted into a bit map which is then transmitted to the target CPLD using a special device programmer.

Although the present invention generally applies to all three parts of the CPLD programming process (i.e., the optimizing, partitioning and placing, and mapping processes), the present invention is particularly directed to partition and placement methods, and to mapping methods.

Several partition and placement methods are known to those of ordinary skill in the art of programming CPLDs. The typical goal of these known partition and placement methods is to pack equations as densely as possible into each function block (i.e., use as many of the resources of each function block as possible) in an attempt to utilize the target CPLD to its maximum capacity. For example, if each function block has 36 input lines and 90 P-term elements, then the equations assigned to each function block are grouped such that the total number of input signals of the group of equations is as close to 36 as possible, or the total number of P-terms of the group of equations is as close to 90 as possible.

In addition, several mapping methods are known to those of ordinary skill in the art of CPLDs. The typical goal of these known mapping methods is to pack the equations (and in particular, the output equations) as closely together as possible to minimize the number of unused P-term elements located between the equations.

A problem associated with the known placement and mapping methods arises when a user wishes to modify a previously-placed logic function. The decision to modify a logic function often occurs after the CPLD incorporating the logic function is integrated into a system (for example, mounted onto a printed circuit board with other integrated circuits). When this occurs, the user typically wishes to "lock" the input/output pin locations of the CPLD such that input/output signals to/from the CPLD are the same after implementing the modification as they were before implementing the modification. This is referred to herein as pin locking, and is beneficial because it avoids the changes to the system (e.g., changing the conductive traces on the printed circuit board) after each modification to the logic function. In other words, after the modification is implemented, it is desirable to apply input signals to and receive output signals from the same pins as those used before the logic function modification. The problem associated with the known placement and P-term mapping methods is that, because the equations are packed tightly into the function blocks, and because the output equations are grouped closely together, it is very difficult to implement modifications (such as adding one or more P-terms to an equation) without changing the input/output pin locations.

SUMMARY OF THE INVENTION

In accordance with the present invention, a CPLD programming process identifies a placement arrangement in which equations of a logic function are distributed among the function blocks of the CPLD, and spaced apart within the function blocks such that subsequent modifications to the logic function do not require changing the input and output pin locations of the CPLD.

In accordance with a first aspect of the invention, a weighting function is utilized to identify, for a selected equation, the function block which best implements the selected equation such that a maximum number of resources are available (i.e., unassigned) in each of the function blocks of the CPLD. By evenly distributing the available resources into the function blocks, the probability is increased that a subsequent modification to the logic function can be implemented without changing the input/output locations, thereby facilitating pin locking.

In accordance with a second aspect of the present invention, the weighting function includes a plurality of variables, each variable being multiplied by, for example, the number of P-term elements assigned to previously-placed equations in each function block. When a valid placement arrangement cannot be determined using the originally-assigned variable values, the variables of the weighting function are modified to emphasize different characteristics (such as the number of P-terms) associated with the equations.

In accordance with a third aspect of the present invention, once the output equations are assigned to the function blocks of the CPLD, the output equations are repeatedly mapped while adding a "phantom" P-term to each equation after each mapping process. By adding "phantom" P-terms to each equation, the effective size of each equation is increased during the mapping process, thereby causing uniform spacing of the output equations in the function blocks. This facilitates pin locking by spreading the output equations within the function blocks such that a maximum amount of P-term elements are available for implementing modifications to any given equation of the logic function.

BRIEF DESCRIPTION OF THE DRAWINGS

These and other features, aspects and advantages of the present invention will become better understood with regard to the following description, appended claims, and accompanying drawings, where:

FIG. 2(C) is a simplified schematic diagram illustrating a product term allocation circuit of the function block shown in FIG. 2(A);

FIG. 3 is a simplified schematic diagram illustrating an input/output block of the CPLD shown in FIG. 1;

FIG. 4 is a simplified schematic diagram illustrating an interconnect matrix of the CPLD shown in FIG. 1;

DETAILED DESCRIPTION

The programming method in accordance with the present invention is described with particular reference to the XC9500 CPLD family manufactured by Xilinx, Inc. of San Jose, Calif. However, the present programming method may be applied to numerous types of PLDs. Therefore, the present invention is not limited to the devices of the XC9500 CPLD family.

CPLD Structure

A brief description of the XC9500 CPLD family is provided to aid in the description of the present programming method. Additional description of the XC9500 CPLD family is provided in *The Programmable Logic Data Book*, pp. 3-1 through 3-67, 1996, published by Xilinx, Inc., which incorporated herein by reference.

Figure 1:
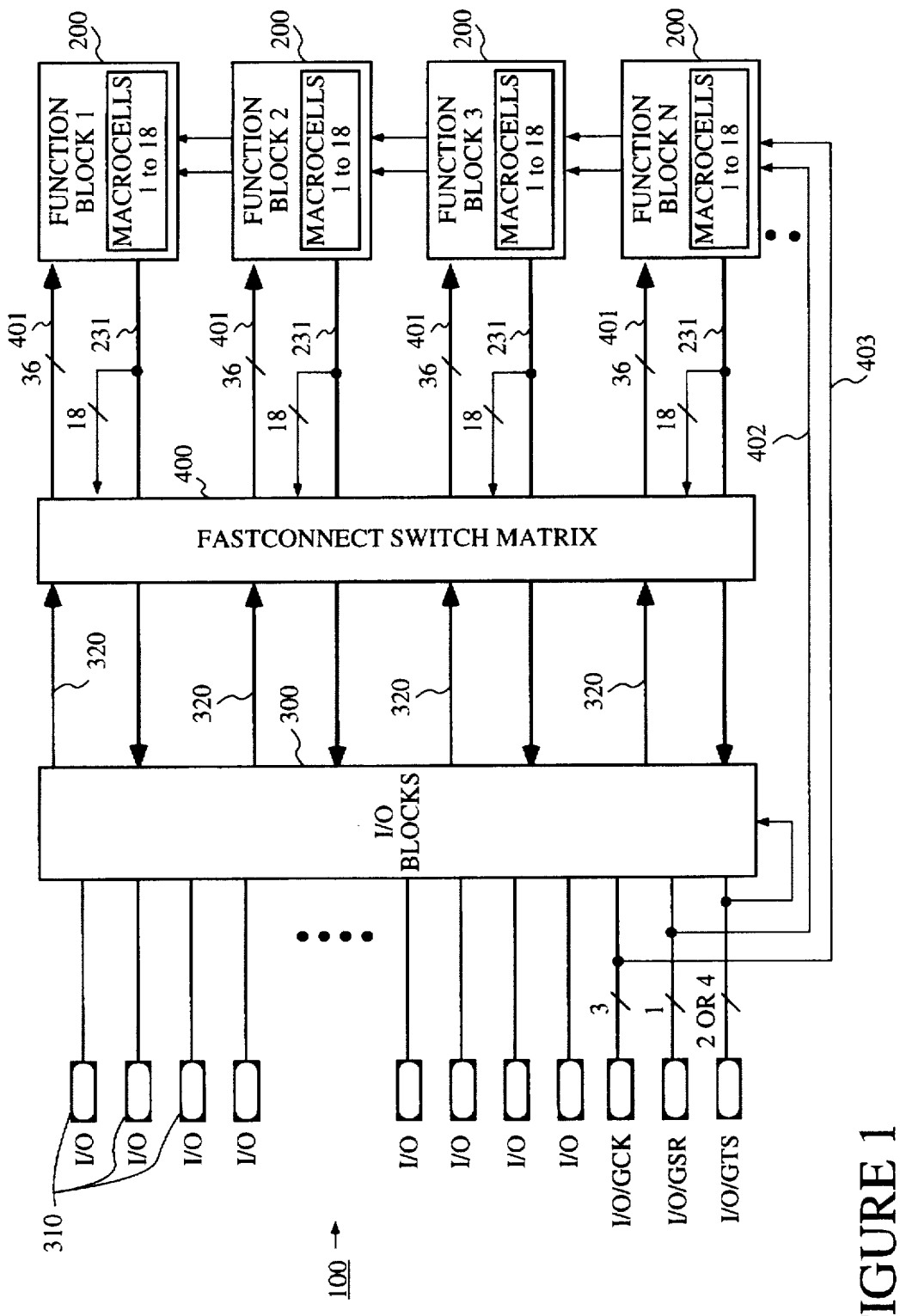
FIG. 1 is a circuit diagram showing a CPLD including multiple function blocks.

FIG. 1 shows a simplified block diagram of a CPLD 100 which includes features common to the XC9500 CPLD family. Each CPLD 100 of the XC9500 CPLD family consists of multiple function blocks (FBs) 200 (four shown) and input/output blocks (IOBs) 300 which are interconnected by a FastCONNECT™ Switch Matrix (FSM) 400. The IOBs 300 provide buffering for device inputs and outputs which are applied to input/output (I/O) pins 310. All input signals from the IOBs 300 enter the FSM 400 on FSM input lines 320, and selected output signals from the FBs 200 are fed-back into the FSM 400 on macrocell output lines 231. Each FB 200 receives thirty-six (36) inputs on FB input lines 401 from the FSM 400 and produces ninety (90) P-term elements which are applied to any of eighteen (18) macrocells, each macrocell being programmable to provide a sum-of-products term from selected P-term elements. For each FB 200, twelve to eighteen outputs are selectively transmitted on macrocell output lines 231 to directly drive the I/O blocks 300 (along with optional corresponding output enable signals). In addition, each FB 200 selectively receives global set/reset signals and global clock signals on global set/reset lines 402 and global clock lines 403, respectively. The function and use of these global signals are discussed below.

Figure 2A:
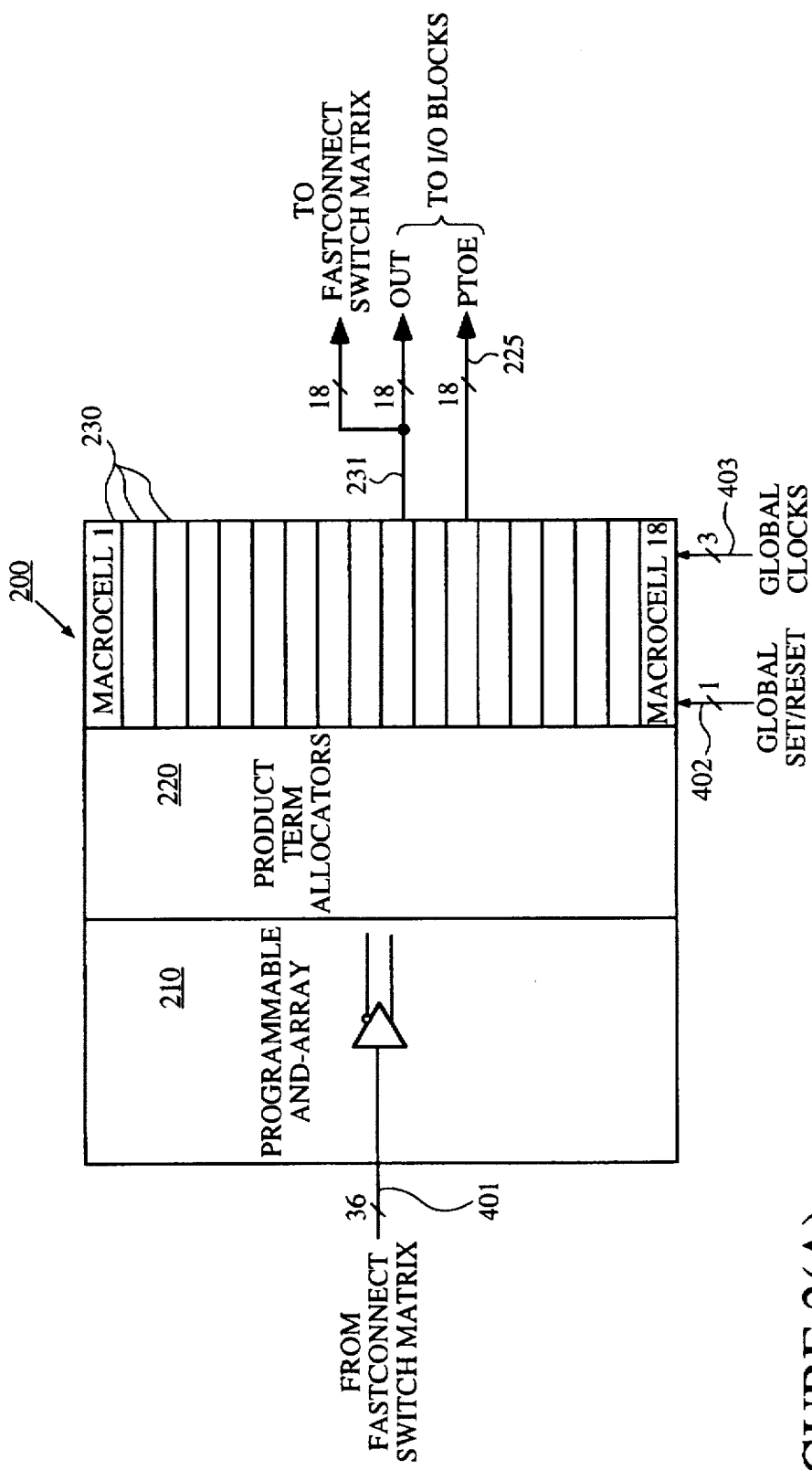
FIG. 2(A) is a simplified block diagram of a function block of the XC9500 CPLD family.

FIG. 2(A) shows a simplified block diagram of an FB 200. Each FB 200 includes an AND array 210, product term allocators 220 and eighteen macrocells 230. The AND array 210 receives thirty-six (36) signals on input lines 401 from the FSM 400 and generates ninety (90) P-term elements which are selectively routed via the product term allocators 220 to the macrocells 230. Outputs from the macrocells 230 are then routed back to the FSM 200 on macrocell output lines 231 for use as input signals in other FBs 200, or are routed to corresponding I/O pins 310 through the IOBs 300 along with optional corresponding output enable (OE) signals, which are transmitted on P-term OE lines 225.

Figure 2B:
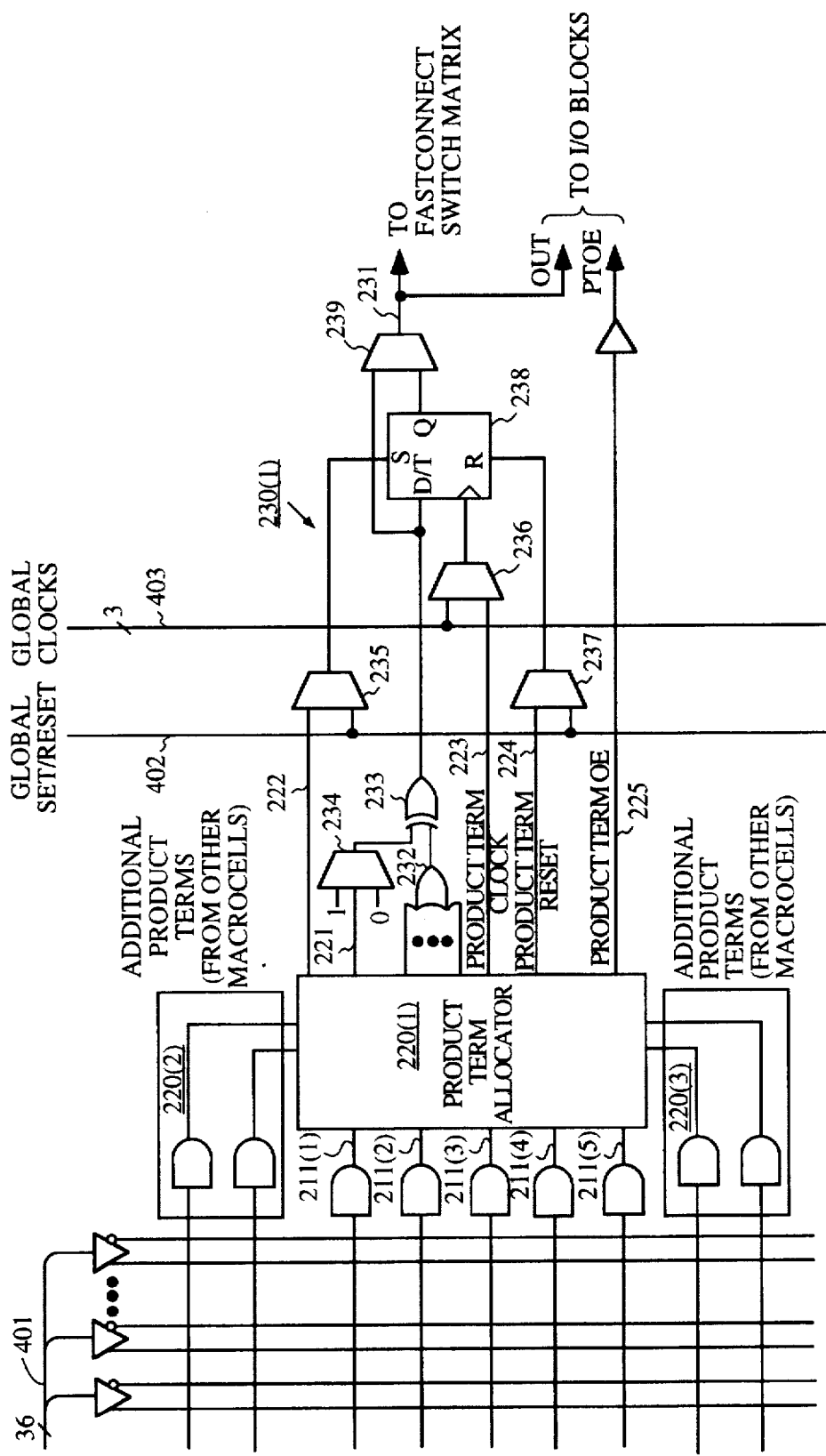
FIG. 2(B) is a simplified schematic diagram illustrating a macrocell of the function block shown in FIG. 2(A)

FIG. 2(B) shows a portion of an FB 200 including a macrocell 230(1). As indicated in FIG. 2(B) and discussed further below, the product term allocator 220(1) programmably connects five direct P-term elements 211(1) through 211(5) to provide the various P-term signals used by macrocell 230(1). In particular, these direct P-term signals are selectively applied to the OR gate 232, to the XOR gate 233 (on XOR MUX line 221 and through XOR MUX 234), to the set MUX 235 (on P-term set line 222), to the clock MUX 236 (on P-term clock line 223), to the reset MUX 237 (on P-term reset line 224), and to provide the optional OE signal (on P-term output-enable line 225). In addition, the product term allocator 220(1) selectively applies "imported" P-term elements from neighboring product term allocators 220(2) and 220(3) to the OR gate 232. Details of the product term allocator 220(1) are provided below.

The XOR MUX 234 programmably applies the signal on XOR MUX line 221, a logic "1" or a logic "0" to the XOR gate 233. In addition, the OR gate 232 generates a sum-of-products term which is applied to the second input of XOR gate 233. The output of XOR MUX 234 is selectively transmitted through D/T flip-flop (D/T FF) 238 and FF MUX 239 as a registered output signal on macrocell output line 231, or directly through FF MUX 239 as a combinatorial output. The remaining P-term elements selectively provide optional control signals for the D/T FF 238 (when a registered output signal is generated), and/or provide optional OE control when the output is directed to an I/O pin 310 (FIG. 1). Specifically, the set MUX 235 selectively passes the signal on P-term set line 222 or a global set signal (received on one of the global set/reset lines 402) to the set (S) terminal of D/T flip-flop 238. The clock MUX 236 selectively passes the signal on P-term clock line 224 or a global clock signal (received on one of the global clock lines 403) to the clock (>) terminal of D/T flip-flop 238. The reset MUX 237 selectively passes the signal on P-term reset line 224 or a global reset signal (received on one of the global set/reset lines 402) to the reset (R) terminal of D/T flip-flop 238. Finally, as discussed above, the P-term OE line 225 is directed to the output blocks 300 (see FIG. 1).

FIG. 2(C) is a simplified diagram showing the internal logic of the product term allocator 220. P-term elements 211(1) through 211(5) are respectively transmitted to demultiplexers (DMUXs) 226(1) through 226(5). DMUXs 226(1) through 226(5) are programmable to route their associated P-term elements to any one of three lines: to an input of an OR gate 227 of the product term allocator 220(1), to an input of the OR gate 232 of the macrocell 230(1) associated with the product term allocator 220(1), or to an associated local P-term line (respectively, XOR MUX line 221, P-term set line 222, P-term clock line 223, P-term reset line 224 and P-term OE line 225).

P-term signals selectively transmitted by DMUXs 226(1) through 226(5) to the OR gate 227 are referred to herein as "exported" P-terms because these P-term signals are transmitted to other macrocells. Specifically, the P-term elements connected by DMUXs 226(1) through 226(5) to the OR gate 227 are "ORed" to produce a sum-of-products term which is applied to OR gate 229(1). OR gate 229(1) selectively "ORs" this sum-of-products term with terms received from either or both adjacent macrocells 220(2) and/or 220(3) (see FIG. 2(B)) which are received through DMUX 228(1) and/or DMUX 228(2), respectively. The output of OR gate 229(1) is then routed through DMUX 228(3) to either of the adjacent macrocells 220(2) or 220(3). As discussed below in additional detail, by selectively combining (ORing) selected P-term elements using the OR gates 227 of the product term allocator 220, it is possible to implement equations having up to ninety (90) P-terms.

As used herein, P-terms which are selectively transmitted to the specific P-term lines 221–225 are referred to as "local" P-terms because these P-terms can only be implemented "locally" (i.e., within their associated macrocell). That is, it is not possible to "import" any P-term from an adjacent macrocell to, for example, apply an asynchronous clock signal to the clock terminal of the D/T FF 238 of the associated macrocell.

In contrast to local P-terms, the term "logic P-term" is used herein to refer to P-terms whose output is applied to the OR gate 232 of a selected macrocell. As described in further detail below, the logic P-terms of an equation can be implemented "locally" by the P-terms assigned to a particular macrocell 230, or can be transmitted to the macrocell from one or more adjacent macrocells via the product term allocator 220.

FIG. 3 is a simplified circuit diagram showing connections between the macrocell 230(1) and a corresponding I/O pin 310(1) through a corresponding IOB 300(1). The IOB 300(1) includes an output enable (OE) MUX 301 through which an OE signal, provided by one of the P-term OE line 225, global OE lines 312(1) though 312(4), a logic "1" or a logic "0", is applied to the control terminal of a tri-state buffer 302. The global OE lines 312(1) through 312(4) are respectively driven by global OE MUXs 311(1) through 311(4), which in turn receive signals from special I/O pins 310(1) through 310(4). When the applied OE signal enables the tri-state buffer 302, a macrocell output signal on macrocell output line 231 is applied to the I/O pin 310(1). Conversely, when the tri-state buffer 302 is turned off, input signals applied to the I/O pin 310(1) are applied to the FSM 400 (see FIG. 1) on FSM input lines 320.

FIG. 4 is a simplified circuit diagram showing connections between function blocks 200(1) and 200(2), IOBs 300(2) and 300(1), and the FSM 400. An FSM input MUX 404 connects each of the function block output lines 231(1) and 231(2) to the FSM 400. FSM/macrocell input lines 405 carry first input FSM signals (true or complement, depending upon the programmed state of the FSM input MUX 404) from the macrocells 230(1) and 230(2). Similarly, input signals from the IOBs 300(1) and 300(2) are respectively entered into the FSM 400 on FSM/IOB input lines 406. All of the FSM/macrocell input lines 405 and the FSM/IOB input lines 406 are programmably connected to each of the FSM output lines 401. In addition, the FSM 400 includes wired-AND 407 which ANDs together two or more signals entering the FSM on FSM/macrocell input lines 405.

Definitions

As described above, up to ninety (90) P-term elements of a given function blocks are usable by a single macrocell by programming the product term allocator to connect the five assigned P-term elements of the macrocell and the eighty-five (85) remaining P-term elements of the function block to the OR gate 232 of the macrocell. However, in practical applications, the number of P-terms making up a given equation is typically much lower than ninety, thereby leaving numerous P-term elements available for implementing other equations of a user's logic function. The programming process according to the present invention addresses the issues of how the equations are placed in the function blocks, and how the P-terms of the placed equations are mapped into the P-term elements of each function block in order to improve the probability of successful pin locking when modifications to the logic function are implemented.

To facilitate the description of the key concepts associated with the P-term mapping process according to the present invention, the following definitions and graphic representations are adopted.

As used herein, the term "placing" refers to both the process of assigning (partitioning) equations to the various function blocks 200 of a target CPLD 100 and to assigning the equations to a specific macrocell 230 of the function block 200, and the term "mapping" refers to the process of assigning each P-term of an equation to one P-term element 211 of the macrocell 230 in which the equation is placed. The term "placement arrangement" refers to the location of each equation after the placement and mapping processes are completed.

As used herein, the term "output equation" refers to an equation whose output is transmitted to an output pin 310 (see FIG. 1) of the CPLD 100. Conversely, the term "node equation" refers to an equation whose output is fed back to the FSM 400.

As used herein, the term "locked equation" refers to an output equation whose output signal is constrained by a user to be applied to a specific I/O pin 310. Because each I/O pin 310 is uniquely connected to an associated macrocell 230, it is necessary to implement each locked equation in the macrocell 230 which is associated with the user-specified I/O pin 310. In contrast, a "non-locked equation" is either a node equation or an output equation whose output pin location is designated as "don't care" by the user.

As used herein, the term "global I/O signal" refers to a signal transmitted on any of the global OE lines 312, the global set/reset lines 402 and the global clock lines 403.

Additional concepts and definitions are described in conjunction with FIGS. 5(A) through 5(D), which illustrate a simplified portion of a function block 200 of the CPLD 100 shown in FIGS. 1-4. Each of these figures includes a simplified block diagram including four macrocells 230(1) through 230(4) of an FB along with associated product term allocators 220(1) through 220(4) and P-term elements 211 (1) through 211(20).

Figure 5A:
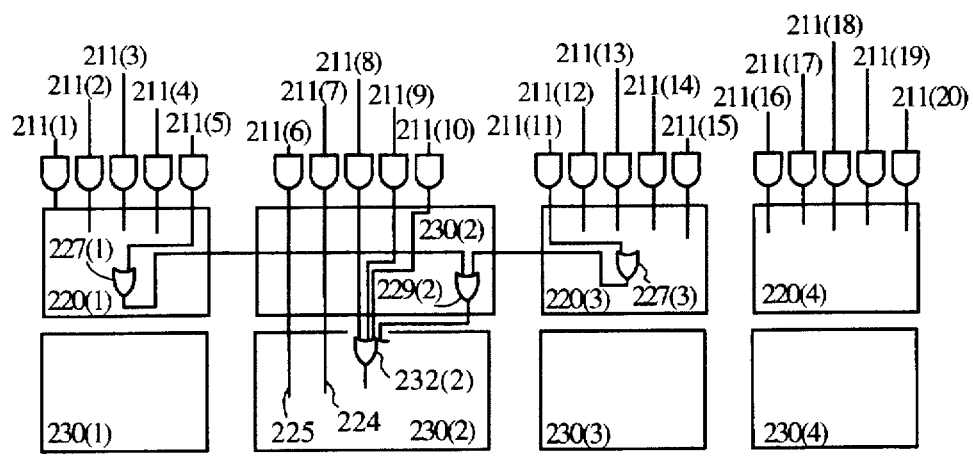
FIGS. 5(A), 5(B), 5(C) and 5(D) show a simplified circuit diagram illustrating an example of equation placement in a CPLD.
Figure 5B:
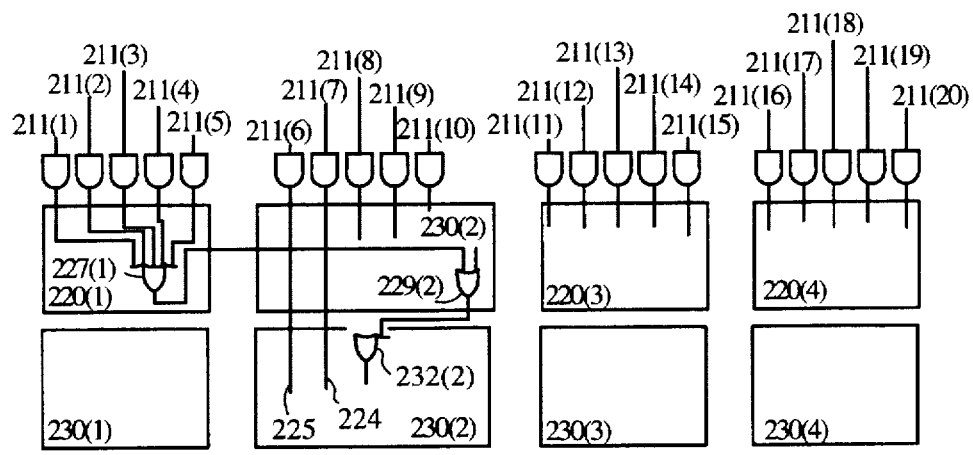
Figure 5C:
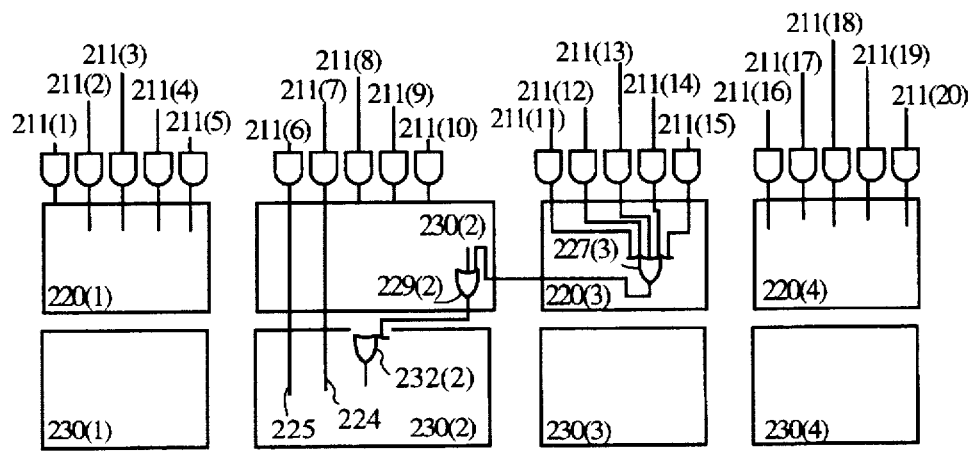

FIGS. 5(A)–5(C) show examples of how an equation is adjustably mapped into a CPLD 100. The equation of this example includes a group of seven P-terms: five logic P-terms and two local P-terms. In these examples, the local P-terms are implemented by P-term element 211(6) (which is connected to P-term output enable line 225) and P-term element 211(7) (which is connected to P-term reset line 224).

FIG. 5(A) shows a first example in which the group of P-terms of the equation is placed in a "centered" position with respect to macrocell 230(2). The term "centered" indicates placement of the equation such that the equation is symmetrically positioned relative to macrocell 230(2). In this example, the equation is mapped into the five P-terms assigned to macrocell 230(2) and one P-term from each of macrocells 230(1) and 230(3). Specifically, the equation is implemented by P-term elements 211(6–10) of macrocell 230(2), of which P-term elements 211(6) and 211(7) are implemented as the required "local" output enable and reset P-terms, respectively, and P-term elements 211(8), 211(9) and 211(10) are implemented as logic P-terms (i.e., applied to the OR gate 232(2)). In addition, the fourth and fifth logic P-terms of the equation are implemented by P-term element 211(5), which is transmitted from macrocell 230(1) to OR gate 232(2) via OR gate 227(1) and OR gate 229(2), and P-term element 211(11), which is transmitted from macrocell 230(3) to OR gate 232(2) via OR gate 227(3) and OR gate 229(2).

As used herein, the process of transmitting P-terms assigned to one macrocell to another macrocell is referred to as "exporting". In the example of FIG. 5(A), P-term elements 211(5) and 211(11) are exported from macrocells 230(1) and 230(3), respectively, to macrocell 230(2) by programming the product term allocators 220(1) and 300(3) to direct these P-terms to the OR gate 232(2) of macrocell 230(2).

FIG. 5(B) shows a second example of the equation shifted to the "left" relative to the "centered" position shown in FIG. 5(A). In this example, the equation is mapped into the five P-terms assigned to macrocell 230(1) and the two local P-terms of macrocell 230(2). Specifically, the equation is implemented by P-term elements 211(1–5) of macrocell 230(1), and by P-terms 211(6) and P-term 211(7) of macrocell 230(2). In this example, all five "logic" P-terms of the equation are exported from macrocell 230(1) to OR gate 232(2) via OR gate 227(1) and OR gate 229(2). Further shifting of the equation to the left is restricted by the equation's local P-terms. That is, local P-terms of a locked equation must be implemented in the designated macrocell—unlike logic P-terms of a locked equation, local P-terms cannot be imported from another macrocell.

FIG. 5(C) shows a third example of the equation shifted to the "right" relative to the "centered" position shown in FIG. 5(A). That is, the P-terms of the equation are mapped into the five P-terms assigned to macrocell 230(3) and the two local P-terms of macrocell 230(2). Specifically, the equation is implemented by P-term elements 211(11–15) of macrocell 230(3), and P-term elements 211(6) and 211(7) of macrocell 230(2). In this example, all five "logic" P-terms of the equation are exported from macrocell 230(3) to OR gate 232(2) via OR gate 227(3) and OR gate 229(2).

Figure 5D:
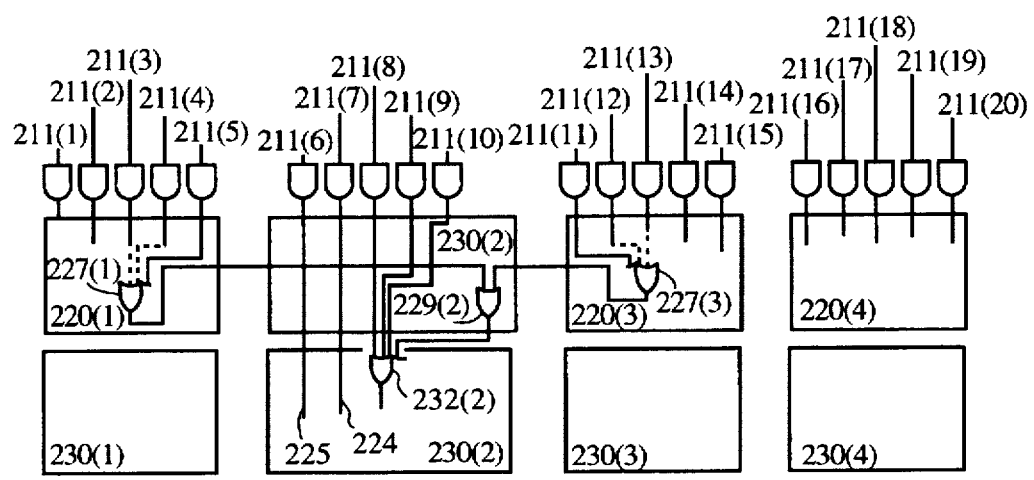

FIG. 5(D) shows a fourth example of the equation in the centered position shown in FIG. 5(A). In the fourth example, four "phantom" P-terms are assigned to the equation which are mapped into P-terms in macrocells 230(1) and 230(3). Specifically, the equation is implemented by P-term elements 211(6–10) of macrocell 230(2), of which P-term elements 211(6) and 211(7) are implemented as the required "local" output enable and reset P-terms, respectively, and P-term elements 211(8), 211(9) and 211(10) are implemented as logic P-terms (i.e., applied to the OR gate 232(2)). In addition, the fourth "actual" P-term and the first and second "phantom" P-terms of the equation are implemented by P-term element 211(3–5), which are transmitted from macrocell 230(1) to OR gate 232(2) via OR gate 227(1) and OR gate 229(2). Likewise, the fifth "actual" P-term and the third and fourth "phantom" P-terms of the equation are implemented by P-term elements 211(11–13), which are transmitted from macrocell 230(3) to OR gate 232(2) via OR gate 227(3) and OR gate 229(2).

As discussed in additional detail below, the "phantom" P-terms shown in the fourth example are assigned to each equation before the mapping process and are ignored in the final placement arrangement. That is, "phantom" P-terms are assigned to each equation and are treated as "actual" P-terms during the mapping process. This causes the mapping process to assign more P-term elements to each equation than there are "actual" P-terms in the equation. When the mapping process is complete, the "phantom" P-terms are ignored (i.e., they are not connected through the product term allocators 220 to the macrocells 230). That is, the final placement arrangement of the equation shown in FIG. 5(D) is identical to that shown in FIG. 5(A). This results in a placement arrangement in which "gaps" of un-assigned P-term elements are positioned between each adjacent pair of equations. As discussed further below, these "gaps" are provided to implement modifications to the equations (such as the addition of P-terms) such that the modified CPLD placement arrangement does not require changing input/output pins.

FIGS. 6(A) through 6(D) are simplified diagrams illustrating the placement examples of FIGS. 5(A) through 5(D), respectively. According to the simplified representation introduced in FIGS. 6(A) through 6(D), the macrocells 230(1–4) are represented by sections of a continuous strip 630 which also includes macrocells 230(5–7). In addition, the equation mapped in FIGS. 5(A) through 5(C) is represented by a block 600 in FIGS. 6(A) through 6(C). The position of block 600 relative to the macrocell strip 630 indicates the equation's placement (i.e., the approximate position of the group of P-term elements implementing the equation are located under the block).

Figure 6A:
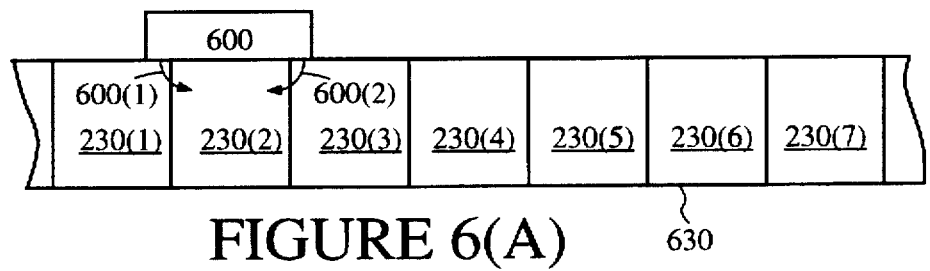
FIGS. 6(A), 6(B), 6(C), 6(D), 6(E) and 6(F) show a simplified graphical representation of the equation placement examples shown in FIGS. 5(A) through 5(D)

For example, the "centered" placement of the equation shown in FIG. 5(A) is represented in FIG. 6(A) by block 600 which is centered over macrocell 230(2). Further, the leftward boundary of block 600 extends over a portion of macrocell 230(1), indicating that one of the equation is implemented by P-terms from both macrocells 230(1) and 230(2). The arrow 600(1) signifies that one or more P-terms are exported from macrocell 230(1) to macrocell 230(2). Likewise, the rightward boundary of block 600 extends over a portion of macrocell 230(3), indicating that the equation is also implemented by one or more P-terms assigned to macrocell 230(3). The arrow 600(2) indicates that the utilized P-terms of macrocell 230(3) are exported to macrocell 230(2).

Figure 6B:
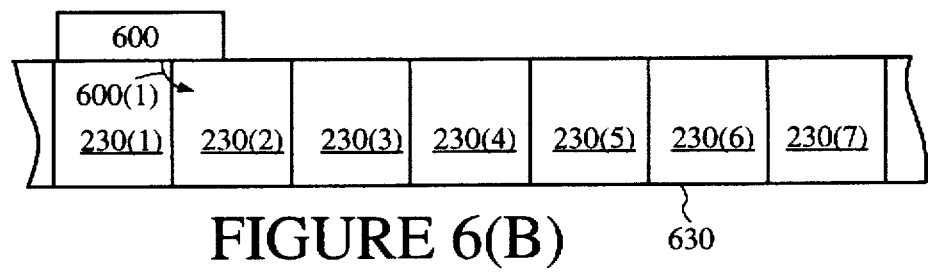

FIG. 6(B) illustrates the leftward-shifted placement arrangement of the equation of the example shown in FIG. 5(B). The leftward boundary of block 600 extends over the entire macrocell 230(1), indicating that all of the P-terms of macrocell 230(1) are utilized by the equation. The arrow 600(1) signifies that all of these P-terms are exported from macrocell 230(1) to macrocell 230(2).

Figure 6C:
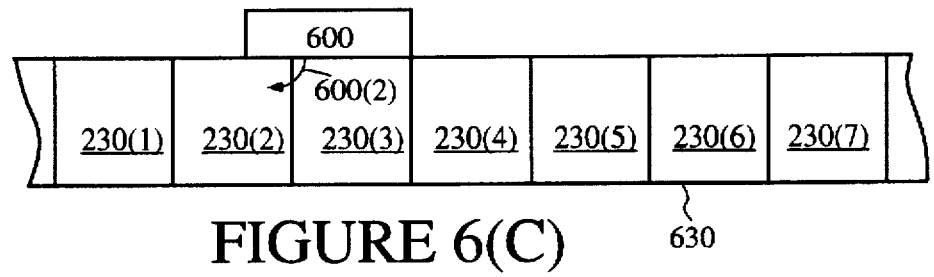
Figure 6D:
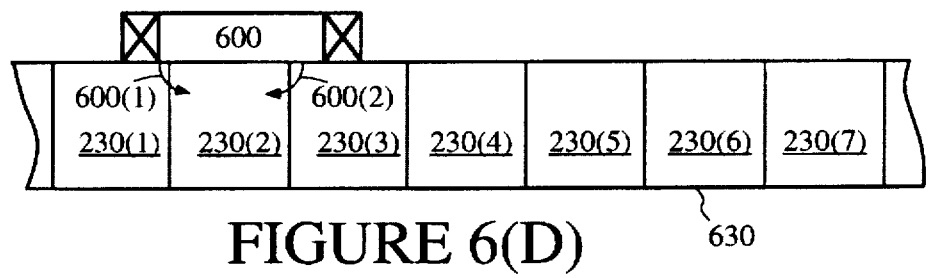

FIG. 6(C) illustrates the rightward-shifted placement arrangement of the equation of the example shown in FIG. 5(C). The rightward boundary of block 600 extends over the entire macrocell 230(3), indicating that all of the P-terms of macrocell 230(3) are utilized by the equation. The arrow 600(2) signifies that all of these P-terms are exported from macrocell 230(3) to macrocell 230(2). Finally, FIG. 6(D) illustrates the centered placement arrangement of the example shown in FIG. 5(D), with the "phantom" P-terms identified with an "X".

Figure 6E:
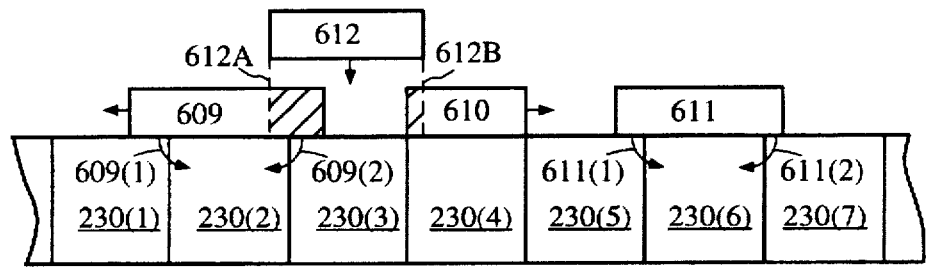
Figure 6F:
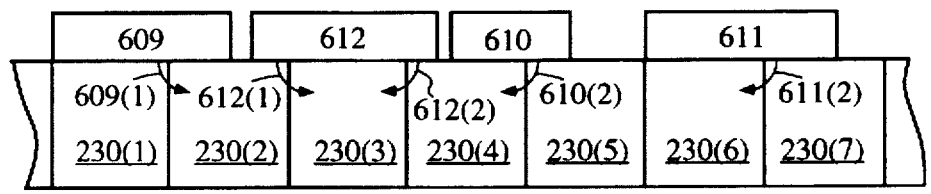

FIG. 6(E) and 6(F) illustrate an example how equations are adjusted ("pushed") to make necessary P-term resources available for mapping an equation. As shown in FIG. 6(E), equations 609, 610 and 611 are previously mapped, and equation 612 is designated for implementation in macrocell 230(3). Mapped equation 609 is implemented in 230(2) and imports P-terms from macrocell 230(1) (indicated by arrow 609(1)), and from macrocell 230(3) (indicated by arrow 609(2)). Mapped equation 610 is implemented in 230(4), and mapped equation 611 is implemented in macrocell 230(6) and imports P-terms from macrocell 230(5) (indicated by arrow 611(1)), and from macrocell 230(7) (indicated by arrow 611(2)).

As indicated by dashed lines 612A and 612B, mapping of equation 612 into the "slot" (area between equations) provided between equations 609 and 610 would not produce a valid placement because of the resultant "overlap" (concurrent use of specific P-terms in two or more equations) that this placement arrangement would produce. For example, in FIG. 6(E), the potential overlap of equation 612 on equations 609 and 610 is indicated by the shaded area in equations 609 and 610. In order to map equation 612 between equations 609 and 610, it is necessary to re-position (re-map) equations 609 and 610 to free sufficient P-term resources to implement the equation 612.

As used herein, "pushing" refers to the process of adjusting an equation to make P-term resources available for the mapping of an additional equation. The phrase "push to the left" refers to the process of pushing an equation in a first relative "direction" along the "line" of macrocells, and the term "push to the right" refers to the process of pushing an equation in a second relative "direction" which is opposite to the first direction.

One method of eliminating the overlap between equations 609 and 612 is to push equation 609 to the left (in the direction of the arrow extending from equation 609). Likewise, another method of eliminating the overlap between equations 610 and 612 is to push equation 610 to the right (in the direction of the arrow extending from equation 610).

FIG. 6(F) shows a placement arrangement of equations 609–612 after pushing equations 609 and 610. Equation 609 is implemented in macrocell 230(2) and imports P-terms from macrocell 230(1) (indicated by arrow 609(1)). Equation 612 is implemented in macrocell 230(3), as required, and imports P-terms from macrocell 230(2) (indicated by arrow 612(1)) and from macrocell 230(4) (indicated by arrow 612(2)). Equation 610 is implemented in macrocell 230(4) and imports P-terms from macrocell 230(5) (indicated by arrow 610(2)). Finally, equation 611 is implemented in macrocell 230(6) and imports P-terms from macrocell 230(7) (indicated by arrow 611(2)).

Programming Method

A CPLD programming method according to the present invention will now be discussed.

System Context of the Invention

Figure 7:
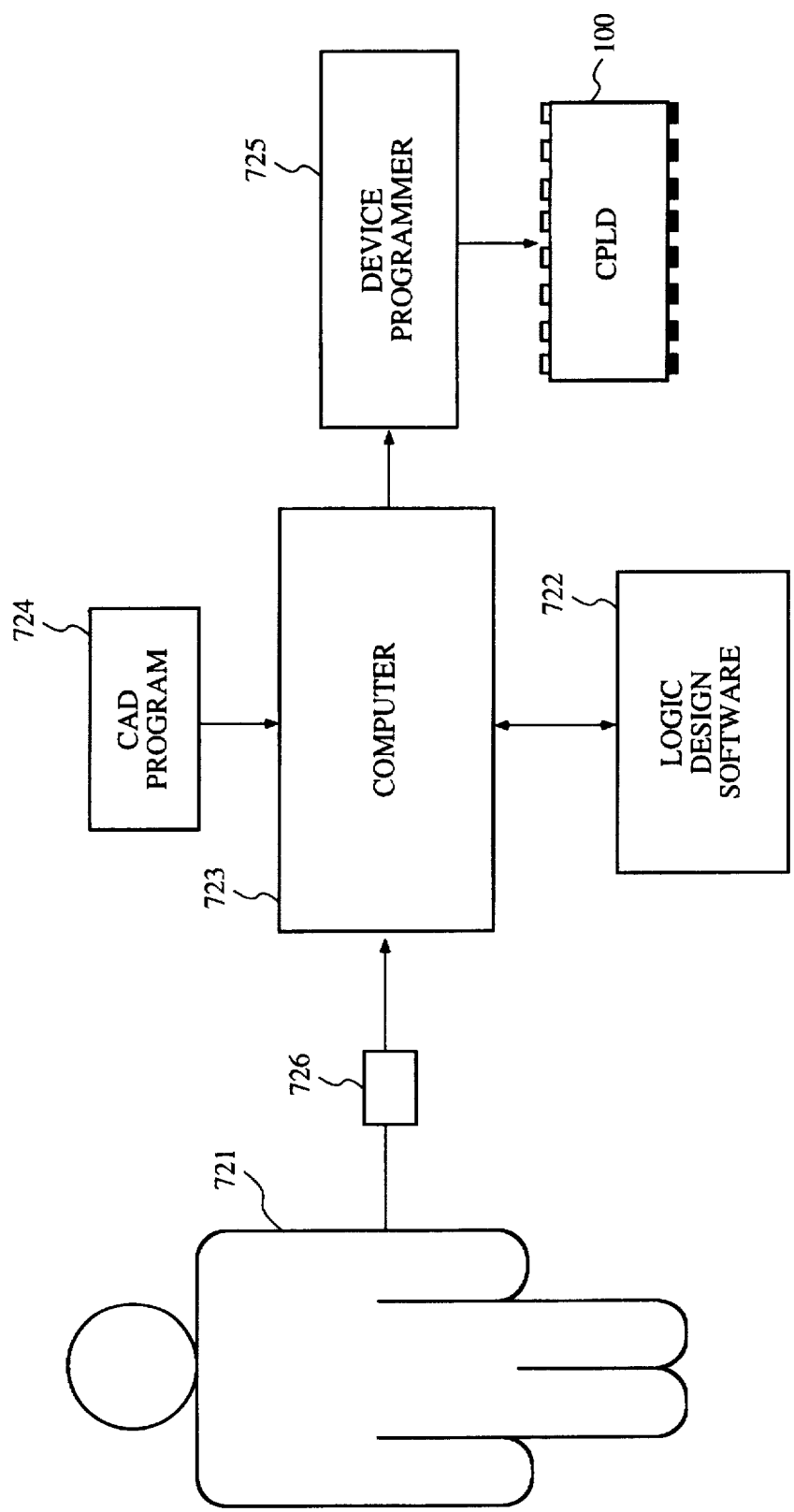
FIG. 7 is a block diagram illustrating a system of programming a CPLD using the P-term mapping method of the present invention.

FIG. 7 shows a "machine" for programming a CPLD 100 in accordance with the present invention. A human user 721 provides the CPLD 100 to be programmed and specifies the logic function (circuit design) which the CPLD 100 is to implement. Logic design software 722 and CAD software 724 (jointly referred to herein as the "high level program") operating in a computer 723 take the logic function specified by the user 721 and determine how to "map" the logic efficiently onto the CPLD 100. Logic design software 722 is used to carry out the steps shown in FIGS. 8-11, and described further below. If the specified logic function is represented in a schematic or high-level language format, the logic design software 722 may be used to transform the function from that format to a set of Boolean sum-of-products equations prior to carrying out the steps in FIGS. 6-11. The set of Boolean equations includes both sequential (registered) equations and combinatorial equations. Such format transformation procedures are well known in the art and readily available. The programming method shown in FIGS. 8 through 11(C), however, discloses aspects particular to the present invention. The CAD software 724 is used after the logic design software 722, and produces a bit-map file that indicates to a device programmer 725 the values to program into the CPLD 100. This bit-map file, also known as a hex file, is a list of the programmable connections of the AND-array and OR-array of each function block, of the logic expander or interconnect matrix, and other setting of the CPLD 100. The device programmer 725 physically programs the contents of the bit-map file into the CPLD 100. The physical form of the programming or configuring depends on the manufacturing technology of the CPLD 100. If, for example, the CPLD 100 is an EPROM or EEPROM device, the EPROM or EEPROM cells are programmed by charging or discharging a floating gate or other capacitance element. Other PLD devices may be programmed using similar device programmers by blowing fuses. One device programmer 25 that may be used is the HW-130 available from Xilinx, Inc. of San Jose, Calif. It connects to computer 23 via an RS232 serial port. A software driver provided for the HW-130 programmer downloads programs and data from the computer 23 to the device programmer 25. Thus, the interacting elements 21-25 of the machine in FIG. 7 carry out a process that reduces the CPLD 100 from an unprogrammed state to programmed state that can carry out the specified logic function.

Method Steps

The CPLD programming method in accordance with the present invention is shown in FIGS. 8-11(C). The programming method is called after a logic function is optimized into a plurality of equations which are stored as an equation set.

Figure 8:
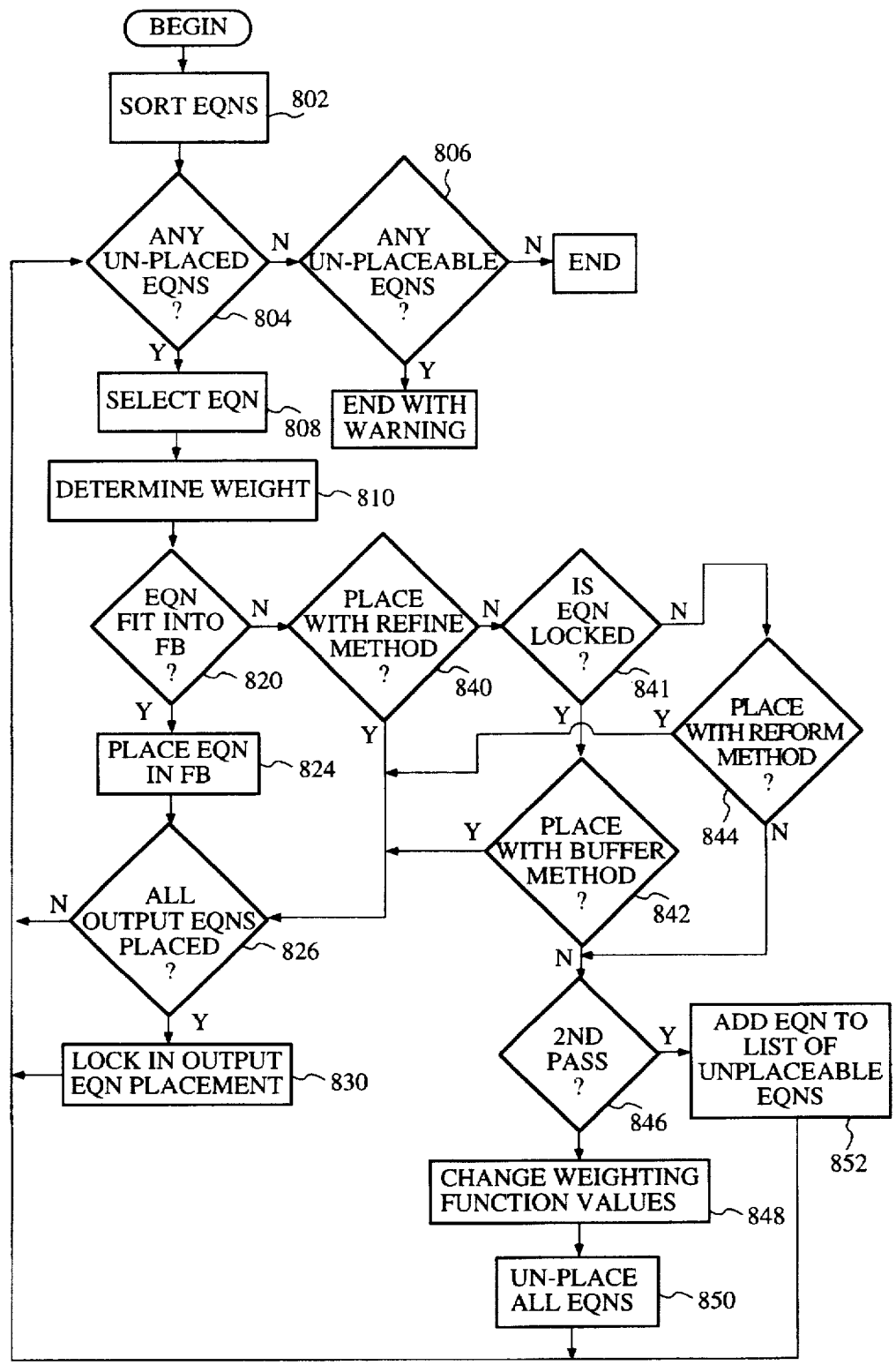
FIG. 8 is a flow diagram showing the CPLD programming method according to the present invention.

FIG. 8 is a flowchart showing an example of the CPLD programming process of the present invention. The process begins with step 802.

In step 802, all of the equations in the equation set are sorted (assigned a placement priority value) according to their equation type and size. Equations whose placement is restricted in some way are assigned a higher placement priority value than equations whose placement is relatively more flexible. For example, the output signals from locked equations must be placed in a particular macrocell of a particular function block. Therefore, locked equations are assigned a higher placement priority than non-locked output equations. Similarly, non-locked output equations are assigned a higher priority than node equations because non-locked output equations must be implemented in macrocells whose output is connected to an I/O pin, while node equations can be implemented in any macrocell.

In accordance with an embodiment of the present invention directed to the Xilinx XC9500 family of CPLDs, the equations of an equation set are prioritized in the following order of highest priority to lowest priority: locked equations, global I/O signals, global input signals (such as the fast clock and global output enable signals), output equations assigned to a particular function block, node equations assigned a function block, non-locked output equations, and, finally, node equations. This list is exemplary, one of ordinary skill in the art would recognize that the relative flexibility of any two particular equation types may depend on the particular circuitry adopted in the target CPLD. Further, additional equation types or functions of two or more equation types may be utilized to meet the particular requirements either placed on a logic function by a user, or resulting from the particular circuitry utilized in a target CPLD.

The equations of each particular equation type are also prioritized based on equation size (i.e., the number of function block input lines and P-term elements required to implement the equation). In the present embodiment, equations having a larger number of function block inputs are given highest priority. In the event that two same-type equations have the same number of function block inputs, the equation having the highest number of P-terms is give priority. This secondary prioritizing criterium is adopted in view of the relatively low number of function block inputs (36) as compared to the number of P-terms (90) of each function block of a Xilinx XC9500 CPLD. One of ordinary skill would recognize that this prioritizing criterium could be reversed if a target CPLD had a different circuit structure including, for example a greater number of function block inputs. After prioritizing all of the equations, control is passed to step 804.

In step 804, the queue is accessed to determine whether all equations have been processed (i.e., whether any equations remaining in the queue are placable). When all of the equations in the queue have been processed in accordance with the steps described below, the result of step 804 is "no", thereby passing control to step 806 (discussed below). Of course, the first time step 804 is called the result of this decision is "yes", thereby passing control to step 808.

In step 808, the equation stored in the queue having the highest placement priority value is selected. As mentioned above, the placement priority value of the selected equation is determined by the type and size of the selected equation. Control is then passed to step 810.

Figure 9:
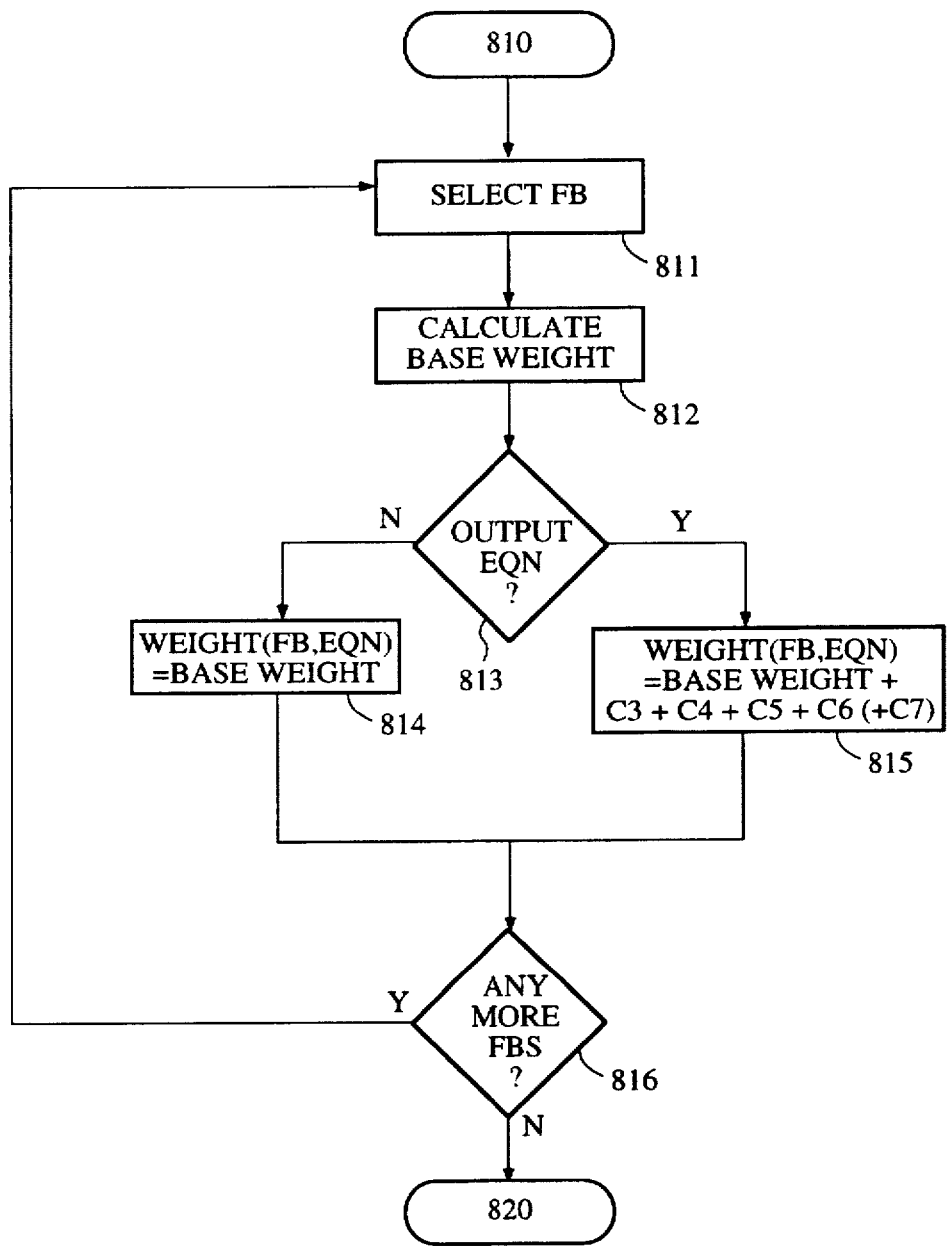
FIG. 9 is a flow diagram showing a sub-process for calculating a weight value in accordance with the present invention.

In step 810, in accordance with a first aspect of the present invention, a weighting function subroutine is called in which a weight value is calculated for each function block to determine which function block will implement the selected equation while preserving the best-possible pin lock flexibility of the target CPLD. FIG. 9 illustrates one example of such a subroutine.

Referring to FIG. 9, in step 811 a function block FB is selected from the plurality of function blocks associated with the target CPLD. Each function block is selected only once during this subroutine, and the function blocks may be selected in any order. Once a function block is selected, control is passed to step 812.

In step 812, a base-weight value is calculated for the function block using the following function:

base-weight = $c1$ * (0 if $FB$ is empty, else 1) +

$c2$ * (number of additional $FB$ inputs used if equation is placed in the $FB$).

This function calculates a base-weight value for each function block FB which indicates the relative benefit of placing the selected equation into a particular function block. The variables c1 and c2 in the function are determined from experience and, as discussed below, are selectively changed to produce a different placement arrangement. In one embodiment, the variable c1 is initially given a value of 20, and the variable c2 is given an initial value of 5.

The variable c1 is multiplied by 0 if the selected function block is empty (i.e., there are no previously-considered equations placed into the function block), and is multiplied by 1 if one or more equations are present in the function block. The variable c1 tends to place equations into empty function blocks.

The variable c2 is multiplied by the number of FB inputs which would only be used by the selected equation if the selected equation is placed in the selected function block. For example, if the selected equation includes two FB inputs and the selected function block is empty, then the number of additional FB inputs used if the equation is placed would equal two. As a second example, if the selected equation includes two FB inputs, the selected function block includes one previously-placed equation having two FB inputs, and the FB inputs of the selected equation differ from the FB inputs of the previously-placed equation, then the number of additional FB inputs used if the equation is placed would again equal two. As a final example, if the selected equation includes two FB inputs and the selected function block includes one previously-placed equation having two FB inputs, and the FB inputs of the selected equation are the same (i.e., both equations are derived from the same FB input signals), then the number of additional FB inputs used if the equation is placed would equal zero—that is, adding the selected equation to the function block does not increase the number of FB inputs used to implement both equations.

The number of FB inputs calculated in step 812 indicates where an equation might be placed to utilize FB inputs most efficiently. The value c2 is multiplied by a relatively low number for function blocks where one or more of the FB inputs of the selected equation are shared by one or more previously-placed equations, thereby producing a relatively low base-weight value. Conversely, in function blocks where no FB inputs are shared, the selected equation yields a relatively high base-weight value due to the variable c2 multiplied by a relatively high number.

The subroutine also determines whether the selected function block has sufficient resources available to place the selected equation. For example, if the selected equation has 30 P-terms and the selected function block has only 20 free P-term elements, then it is not possible to place the selected equation in the selected function. When the selected function block cannot support the selected equation, for example, a "can't support the selected equation" flag is set.

After calculating the base-weight value for the selected function block by summing variables c1 and c2 (as modified by their respective terms), control is passed to step 813.

In step 813, the parameters of the selected equation are checked to determine if the selected equation is an output equation or a node equation. If the selected equation is a node equation, then control passes to step 814, where the weight value for the selected function block is set at the base-weight calculated in step 812. Conversely, if the selected equation is an output equation, then control passes to step 815.

In step 815, the weight value for the selected function block when the selected equation is an output equation is calculated by the following equation:

weight($FB,EQN$) = base-weight + $c3$ * (number of P-terms used in $FB$) +

$c4$ * (number of output equations in $FB$) +

$c5$ * (number of $FB$ inputs used by output equations in $FB$) +

$c6$ * (1 if more than 2/3 of $FBs$ have equations, else 0).

This weighting function yields a relatively low weight value when placement of the selected output equation in the selected function block is predicted to yield a placement arrangement which is most-likely to yield pin locking. The values assigned to the variables c3, c4, c5 and c6 are determined from experience and, as discussed below, are selectively changed when the initially-assigned values fail to produce a valid placement arrangement. In one embodiment, the variables c3, c4 and c5 are initially given values of 10, and the variable c6 is given an initial value of 0 (as discussed below, this value is increased in subsequent iterations of the optimizing and placement method if a successful placement arrangement is not produced during the initial pass).

The variable c3 is multiplied by the number of P-term elements used to implement all previously-placed output equations in the selected function block. If the number of P-term elements used by previously-placed equations is low, then the resulting weight value will be correspondingly low. This tends to yield desirable placement of the selected equation because it tends to place output equations in less-crowded function blocks, thereby making available a maximum number of P-term elements in each function block for implementing changes to the logic function while supporting the flexible pin locking objective.

The variable c4 is multiplied by the number of output equations previously placed in the selected function block. If the number of previously-placed output equations in the selected function block is low, then the resulting weight value for the selected function block is correspondingly low. This tends to yield desirable placement of output equations because it tends to place an equal number of output equations into each function block, thereby increasing the resources in each function block which may be used to implement changes in the logic function while supporting the flexible pin locking objective.

The variable c5 is multiplied by the number of FB inputs used by all previously-placed equations in the selected function block. If the number of FB inputs of the selected function block used by previously-placed equations is low, then the resulting weight value of the selected function block will be correspondingly low. This tends to yield desirable placement of the selected equation because it tends to place output equations in less-crowded function blocks, thereby making available a maximum number of FB inputs in each function block for implementing changes to the logic function while supporting the flexible pin locking objective.

The variable c6 is multiplied by 1 if more than two-thirds of all of the function blocks have previously-placed equations, and multiplied by 0 if less than two-thirds of all of the function blocks have previously-placed equations. On the first pass through step 815, the equation c6 is set to zero, thereby tending to distribute the output equations into all of the function blocks. However, as discussed in additional detail below, in a subsequent pass through step 815, the value assigned to variable c6 is increased significantly (e.g., changed to 1,000). This tends to place all of the output equations into two-thirds of the function blocks, leaving one-third of the function blocks empty for placing the node equations.

After calculating the weight value for the selected function block by summing the base-weight value with the variables c1 through c6 (multiplied by their respective modifiers, discussed above), control is passed to step 816.

In step 816, the subroutine determines whether all function blocks of the target CPLD have been considered in view of the selected equation (i.e., the subroutine determines whether a corresponding weight value has been calculated, or, for example, that a "can't support the selected equation" flag is set for each function block). If any function blocks have not been considered, control is passed to step 811 for selection of another function block. After every function block has been considered, control is passed to step 820.

In step 820, the process determines whether the selected equation fits into at least one function block of the CPLD. If, for example, the "can't support the selected equation" flag is true for every function block, then control is passed to step 840 (discussed below). Conversely, if a weight value is calculated for at least one function block, then control is passed to step 824.

In step 824, all of the calculated weight values for the function blocks are compared to determine which function block has the lowest weight value for the selected equation, and the selected equation is placed in the function block having the lowest weight value. After assigning the selected equation to that function block, control is passed to step 826.

In step 826, the process determines whether all output equations and global I/O signals have been placed. If not, then control is passed back to step 804 for selection of the next equation in the queue. The loop formed by step 804 through step 826 is thereby repeated until all output equations and global I/O signals have been placed, at which time control is passed to step 830.

In step 830, a subroutine is called to lock all of the output equations and global I/O signals into their respectively assigned function blocks. The subroutine is shown in FIG. 10.

Figure 10:
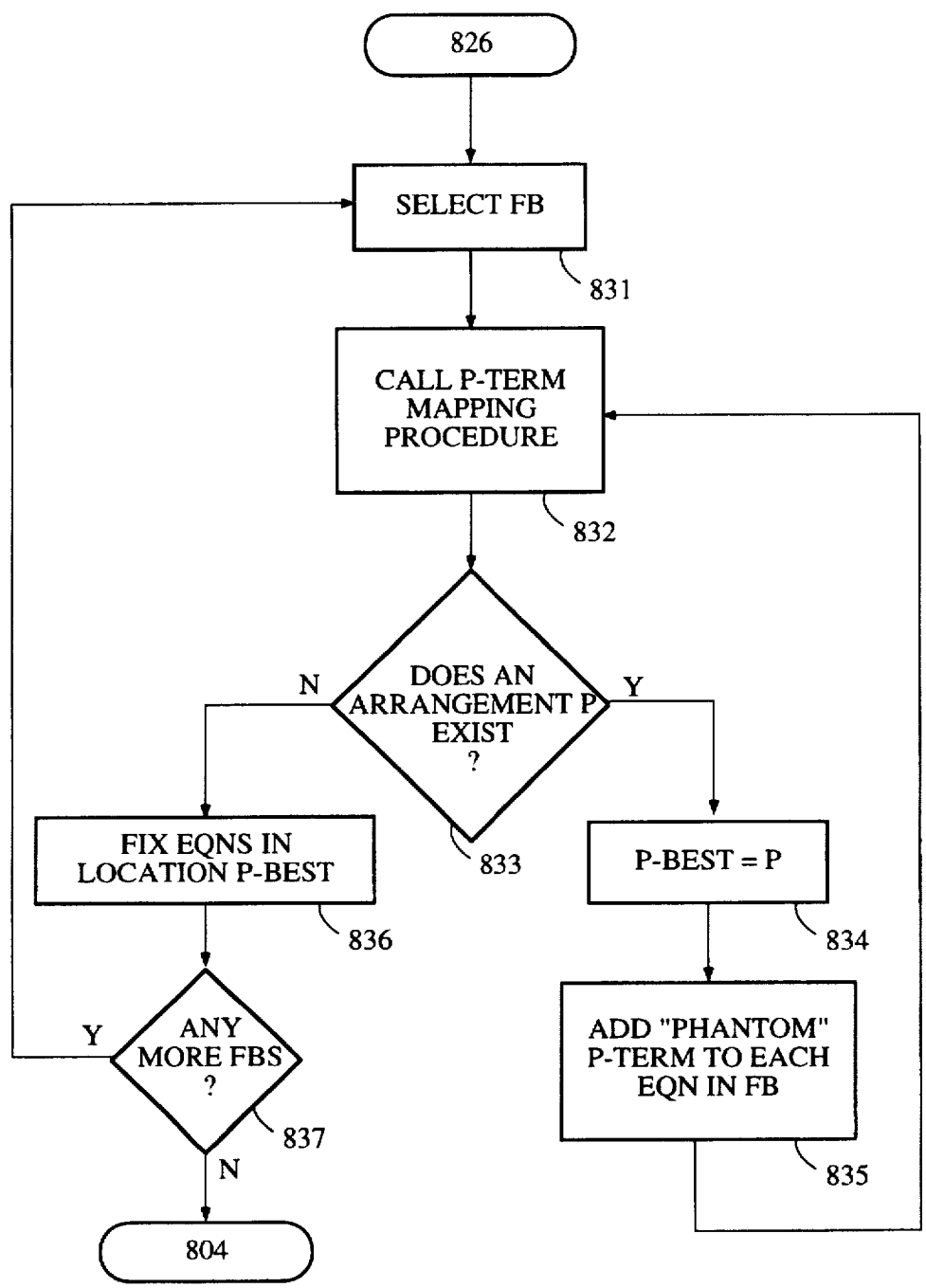
FIG. 10 is a flow diagram showing a sub-process for locking output equations accordance with the present invention.

Referring to FIG. 10, in step 831, a function block FB is selected from the plurality of function blocks associated with the target CPLD. Each function block is selected only once during this subroutine, and the function blocks may be selected in any order. Once a function block is selected, control is passed to step 832.

In step 832, a product term mapping process is called to map the P-terms of the output equations assigned the selected function block. The product term mapping process assigns each P-term of each equation to a specific P-term element of the target CPLD. One example of a product term mapping process which may be used to perform step 832 is disclosed in co-owned U.S. patent application Ser. No. 08/746,603, filed Nov. 13, 1996, which is entitled "Method For Mapping Product Terms In A Complex Programmable Logic Devices". Other known product term mapping processes may also be utilized. The product term mapping process generates (if possible) a placement arrangement P, and then passes control to step 833.

In step 833, the subprocess determines whether a placement arrangement P is obtained by the product term mapping process used in step 832. If no placement arrangement P is obtained, then control is passed to step 836. If a placement arrangement P is obtained, control is passed to step 834.

In step 834, the most recently-obtained arrangement P from the product term mapping process step 832 is stored as a "best" placement arrangement (P-best). For example, the first time step 834 is called for a particular function block, the only arrangement for that function block will be the arrangement P generated in step 832—the memory location for P-best will be empty. At this time, the arrangement P is stored as placement arrangement P-best. During subsequent iterations, any arrangement stored as arrangement P-best is replaced with a newly-obtained arrangement P. After P-best is updated to store arrangement P, control is passed to step 835.

In step 835, a "phantom" P-term is added to every equation placed in the selected function block, and control is then passed back to step 832. The purpose for this step is to obtain a placement arrangement in which all of the output equations are spaced uniformly in the function block, thereby increasing the chances of successfully achieving the pin locking objective in the event that one or more of the output equations is modified to include additional P-terms. That is, after the "phantom" P-term is added to increase the total number of P-terms of every output equation in step 835, control is passed back to the product term mapping process step 832. A loop is thereby created which includes step 832 through step 835 for each function block.

Figure 11A:
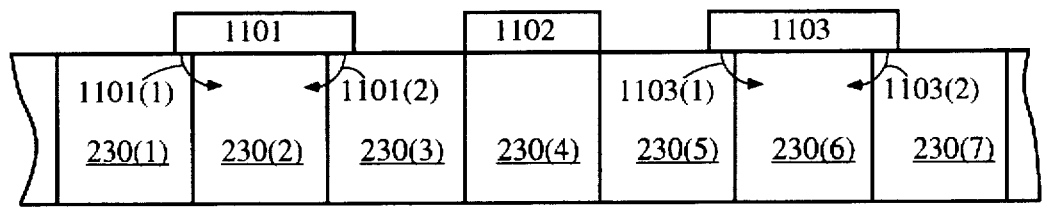
FIGS. 11(A), 11(B) and 11(C) are simplified graphical representations showing a product term mapping process using "phantom" product terms.
Figure 11B:
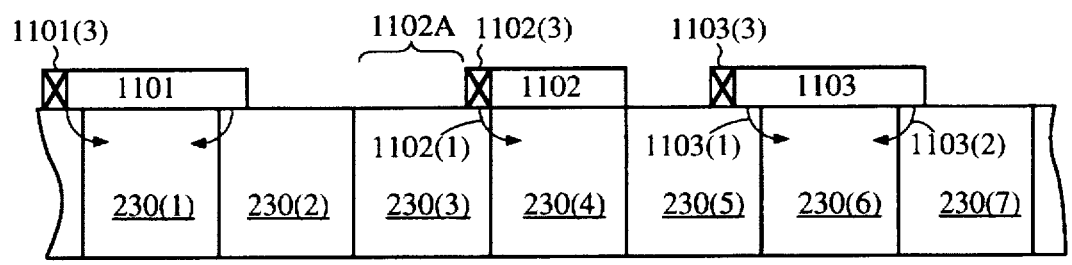
Figure 11C:
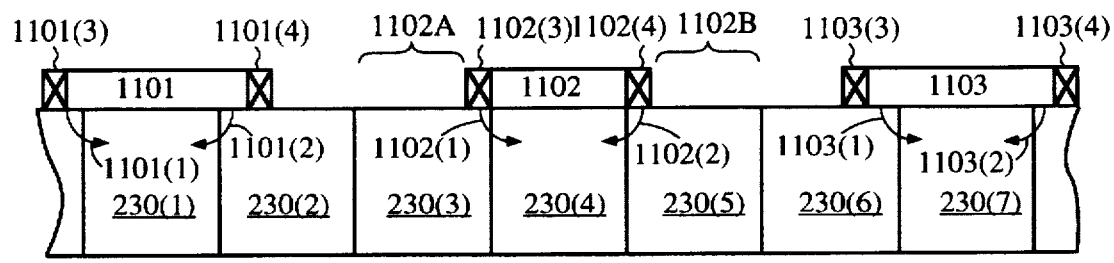

FIGS. 11(A) through 11(C) are diagrams showing a simplified example of how "phantom" P-terms are used to modify the placement arrangement of output equations within a function block to facilitate flexible pin locking.

FIG. 11(A) shows an example of a placement arrangement of three output equations 1101, 1102 and 1103. Equation 1101 has seven P-terms, equation 1102 has five P-terms, and equation 1103 has seven P-terms. The output of equation 1101 is directed through macrocell 230(2), and equation 1101 imports one P-term from each of macrocells 230(1) and 230(3). The output of equation 1102 is directed through macrocell 230(4). Finally, the output of equation 1103 is directed through macrocell 230(6), and equation 1103 imports one P-term from each of macrocells 230(5) and 230(7).

Due to a bi-directional exporting constraint associated with the product term allocators 220 of XC9500 CPLDs, it is not possible to export P-terms from one macrocell to simultaneously two different macrocells. Referring briefly to FIG. 2(C), DMUX 228(3) is programmable to only export P-terms to the left (upward in this figure) or to the right (downward), but not both in both directions. Referring back to FIG. 11(A), this restriction limits the use of P-terms associated with macrocells 230(3) and 230(5) by equation 1102 because P-terms are exported from these macrocells to equations 1101 and 1103, respectively.

The placement arrangement shown in FIG. 11(A) may cause pin locking to fail if a subsequent modification to the logic function causes the number of P-terms in equation 1102 to increase. Namely, if equations 1101 and 1103 cannot be "pushed" to make P-terms available, then equations 1102 will have to be moved to another macrocell, which may cause pin locking to fail.

FIG. 11(B) shows an iteration through the loop including steps 832 through 835 after a "phantom" P-term is added to each equation 1101, 1102 and 1103. Namely, a "phantom" P-term 1101(3) is added to left side of equation 1101, a "phantom" P-term 1102(3) is added to equation 1102, and a "phantom" P-term 1103(3) is added to equation 1103. These "phantom" P-terms have the effect of increasing the number of P-terms of equation 1102 to six, thereby requiring equation 1102 to import one P-term from an adjacent macrocell. Because equation 1102 now imports a P-term from macrocell 230(3), the bi-directional exporting constraint prevents macrocell 230(3) from exporting P-terms to equation 1101. When the mapping process of step 832 is subsequently called, equation 1101 is "pushed" into macrocell 230(1)

such that it imports P-terms from macrocell 230(2), thereby allowing equation 1102 to import one P-term from macrocell 230(3) (as shown by arrow 1102(1)). Therefore, the overall effect of the "phantom" P-term 1102(1) is to spread the output equations 1101, 1102 and 1103 more evenly within the function block. When the "phantom" P-terms are later removed, equation 1102 is free to "expand" into macrocell 230(3) (as shown by bracket 1102A) in response to a subsequent logic function modification.

FIG. 11(C) similarly shows a subsequent iteration through the loop including steps 832 through 835 in which additional "phantom" P-terms 1101(4), 1102(4) and 1103(4) are added to equations 1101, 1102 and 1103, respectively. These "phantom" P-terms have the effect of increasing the number of P-terms of equation 1102 to seven. In the example shown, the phantom P-term 1102(4) is added to the "right" side of equation 1102, thereby causing equation 1102 to import one P-term as shown by arrow 1102(2). Because of the bi-directional export constraint, equation 1103 can no longer import P-terms from macrocell 230(5), and in this example is "pushed" to the right into macrocell 230(7). When the "phantom" P-terms are later removed, the final effect of this process is to allow equation 1102 to further "expand" into macrocell 230(5) (as shown by bracket 1102B), if necessary, in response to a subsequent logic function modification.

The loop including step 832 through step 835 is repeated for each function until a new arrangement P cannot be obtained in step 832, thereby causing the subroutine to exit the loop on the "no" branch in step 833 to step 836.

In step 836, the placement arrangement P-best is "fixed" for the output equations, meaning that the placement arrangement of the output equations cannot be changed when the node equations are mapped using the P-term mapping process. This step assumes at least one arrangement P was obtained in step 832—if no arrangement P was obtained, the subroutine would alert the high level program. Control then passes to step 837.

In step 837, the subroutine determines whether all of the function blocks have been subjected to the locking process. If any of the function blocks have not been locked, then control passes back to step 831 for selection of a new function block. If all function blocks have been locked, then control is passed to step 804 (see FIG. 8).

As mentioned above, the loop formed by step 804 through step 826 is repeated unless the selected equation cannot be placed into any of the function blocks in step 820. When this occurs, control is passed to step 840.

In step 840, a refinement subroutine is called in an attempt to place the selected equation into a function block. Any of the known refinement methods may be used, such as that disclosed by in "Linear-Time Heuristic for Improving Network Partitions" by C. M. Fiduccia and R. M. Mattheyses, IEEE 19th Design Automation Conference, ppg. 175–181 (1982), or the method disclosed in "A Fast Partitioning Method for PLA-Based FPGAs" by Z. Hasan, D. Harrison, and M. Ciesielski, IEEE Design & Test of Computers, ppg. 34–39 (1992), which are incorporated herein by reference.

The refinement subroutine first identifies the function block which has the lowest weight value for the selected equation (as determined in step 810). Although the selected equation cannot be placed within the identified function block, this function block is considered being "closest" to implementing the equation. This "closest" function block may be identified by, for example, identifying the function block having the largest number of available P-term elements, or the function block having the largest number of available inputs. Next, the refinement subroutine un-places (removes) non-locked equations until the selected equation is placed into the selected function block. The un-placed equations are then returned to the queue for consideration in subsequent processing. This refinement subroutine is particularly effective when the selected equation is slightly too large to place in any of the function blocks.

If the equation is successfully placed using the refinement step 840, control is passed to step 826, and the loop including step 804 through step 826 is resumed. However, if refinement fails to place the equation in a function block, then control passes to step 841.

In step 841, the selected equation is checked to determine if the equation is locked or is non-locked. If the equation is locked, control is passed to step 842. If the equation is non-locked, control is passed to step 844.

In step 842, the process attempts to place the locked equations using a buffering subroutine. The buffering subroutine generally includes moving the logic associated with the selected locked equation to a remote macrocell, then routing the output of the remote macrocell to drive the target macrocell. In essence, the remote macrocell is used as a buffer. The buffering process determines which locked equations to buffer by considering all of the locked equations placed in the target function block, and identifying a placement arrangement where the fewest number of locked equations are buffered.

If a placement arrangement is identified by the buffering subroutine, control is passed to step 826, and the loop including step 804 through step 826 is resumed. However, if refinement fails to place the equation in a function block, then control passes to step 846.

In step 844, the process attempts to place the equation using a logic reformulation subroutine. One such logic reformulation process is described in U.S. Pat. No. 5,349, 691, entitled "Programming Process for 3-Level Programming Logic Devices", which is incorporated herein by reference. The logic reformulation subroutine is generally used to create an alternative equation (or equations) which generates the same logical output as the selected equation (or a previously-placed equation), and which is easier to place in the available resources. For example, if a locked equation cannot be placed into a function block already containing two locked equations using the refinement and buffering subroutines (discussed above), then reformulation will consider each of these locked equations and identify one or more which can be split into two sub-equations: one subequation being placed in the function block, and one sub-equation being placed in another function block. The equation is thereby implemented with the two sub-equations, one of which acts as a buffer for a portion of the equations logic.

If a placement arrangement is identified by the logic reformulation subroutine, control is passed to step 826, and the loop including step 804 through step 826 is resumed. However, if refinement fails to place the equation in a function block, then control passes to step 846.

In step 846, the process determines how many times the process has been repeated without finding a placement arrangement for the selected equation. That is, the first time an equation is considered and passes on the "no" branch of step 820, through step 840, step 842, and step 844 to step 846, the number of passes determined in step 846 is one. If the number is greater than one (for example, two), then control is passed to step 852 (discussed below). Conversely, if the number is one, control is passed to step 848.

In step 848, the values assigned to variables c1 through c6 are changed to emphasize a different characteristic of the equations in the equation set. For example, the original (default) values for the variables c1 through c6 may over-emphasize locked equations, or under-emphasized the number of P-terms. In step 848, the failed placement is analyzed to determine why the selected equation could not be placed, and to change the values of variables c1 through c6 in an attempt to yield a successful placement arrangement. For example, if a particular equation cannot be placed because insufficient P-terms are available, the variable c3 is modified such that the number of P-terms of the equations in each function block becomes more important in determining which function block receives a selected equation, and the values of variables c4 through c6 are lowered, thereby de-emphasizing the attributes represented by these variables.

In the practical embodiment, after the first iteration the variable c6 is made by far the largest factor (i.e., the value of variable c6 is changed from zero to 1,000). By increasing the value of the variable c6, the output equations tend to be placed within a predetermined group which includes two-thirds of the total number of function blocks, thereby leaving resources in the remaining one-third of the function blocks for placing the remaining equations.

After changing the values of c1 through c6, control is passed to step 850, in which all of the equations are unplaced (i.e., moved back into the queue). Control then passes back to step 804, where the process is restarted using the modified variables c1 through c6.

As mentioned above, if the number of passes through step M is, for example, two, then control is passed to step 852. In step 852, the selected equation is marked as "unable to place", and control is passed to step 804. The process then continues for all remaining equations in the queue. Once the queue is empty (except for the equation flagged "unable to place"), control is passed to step 806.

In step 806, if all of the equations were placed using the preceding steps, then the process ends and transmits the final placement arrangement to the high level program for generation of a bit map for programming the CPLD 100. Conversely, if any equations are flagged "unable to place" in step 852, then control is returned to the high level program with a message that the logic function cannot be placed in the target CPLD. One possible alternative solution may be to implement a conventional partition and placement algorithm instead of the present method.

After successfully identifying a valid placement arrangement, control is passed to the high level program to begin the process of forming a bit map, as discussed above.

Although the present invention has been described in considerable detail with reference to certain preferred embodiments thereof, other embodiments are possible. For example, the weighting function may be modified to include an additional timing constraint factor c7 (as shown parenthetically in step 815 of FIG. 9). The timing constraint factor c7 seeks placement arrangements which decrease timing delays. The timing constraint factor c7 is therefore greater for function blocks where placement of the selected equation would produce greater timing delays, and less for function blocks where placement would produce lesser timing delays.

Figure 12A:
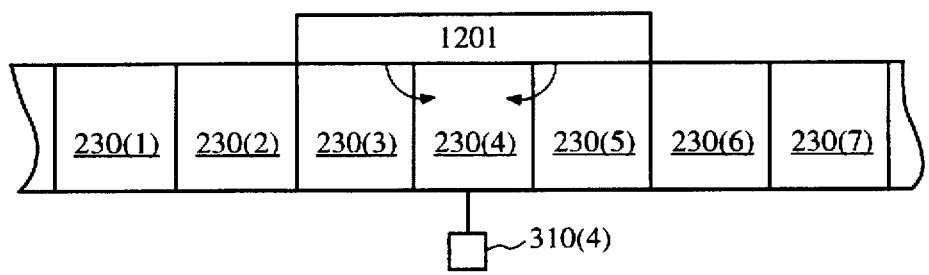
FIGS. 12(A and 12(B) are simplified graphical representations showing an alternative embodiment of the weighting function used in accordance with the present invention.
Figure 12B:
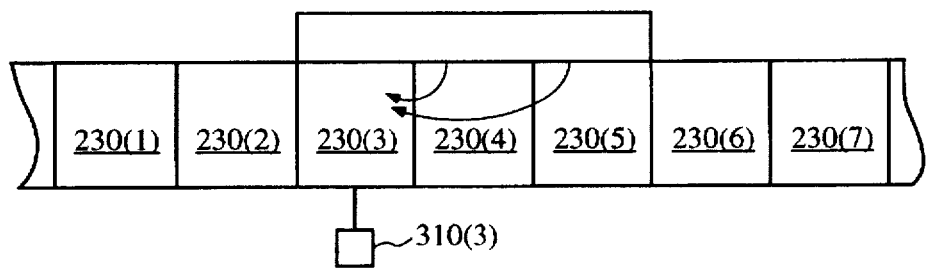

FIGS. 12(A) and 12(B) shows diagrams illustrating examples of placement arrangements which produce different timing delays. In each figure, a fifteen P-term equation is mapped into three macrocells. In FIG. 12(A), equation 1201 is mapped into macrocells 230(3), 230(4) and 230(5), and transmits its output to pin 310(4) through output macrocell 230(4). This placement arrangement produces a relatively short timing delay because P-terms are imported from macrocells 230(3) and 230(5), which are immediately adjacent output macrocell 230(4). Alternatively, in FIG. 12(B), equation 1201 is mapped into macrocells 230(3), 230(4) and 230(5), and transmits its output to pin 310(3) through output macrocell 230(3). This placement arrangement produces a relatively long timing delay because P-terms are imported from macrocells 230(5) into 230(3), which produces an added timing delay as these P-terms pass through macrocell 230(4). Therefore, the factor c7 would be lower for the placement arrangement shown in FIG. 12(A) than the placement arrangement shown in FIG. 12(B), thereby tending to place equation 1201 in function blocks supporting the placement arrangement shown in FIG. 12(A).

In view of the above mentioned alternative embodiments, the spirit and scope of the appended claims should not be limited to the description of the preferred embodiments contained herein.

We claim:

1. A method for programming a programmable logic device to implement a logic function, the programmable logic device including a plurality of function blocks, each function block having an AND array including a plurality of input lines, the AND array being programmable to generate a plurality of product term elements from signals applied to the input lines, each function block also including a plurality of macrocells, each macrocell having an OR gate programmably connected to the product term elements from the AND array, the method comprising the steps of:

dividing the logic function into a set of equations, each equation including one or more input terms which are assignable to the input lines of a selected function block, one or more product terms which are mappable into the product term elements of the selected function block;

selecting an equation from the set of equations;

calculating a weight value for each function block of the plurality of function blocks, the weight value being directly proportional to a number of equations previously-assigned to said each function block and to the number of input lines of said each function block which would only be used by the selected equation;

assigning the selected equation to the function block having the lowest weight value;

creating a bit map whose contents are defined by the placement arrangement produced after the step of assigning; and transmitting the bit map to the programmable logic device such that the programmable logic device is programmed to implement the logic function in accordance with the bit map.

2. The method according to claim 1, wherein the weight value for each function block is directly proportional to a number of product terms associated with equations previously-assigned to said each function block.

3. The method according to claim 1, wherein the weight value for each function block is directly proportional to a number of output equations previously-assigned to said each function block.

4. The method according to claim 1, wherein the weight value for each function block is directly proportional to a number of input terms associated with output equations previously-assigned to said each function block.

5. The method according to claim 1, wherein the weight value for each function block is directly proportional to a number of function blocks to which output equations have been previously-assigned.

6. The method according to claim 1, wherein the step of selecting comprises determining a placement priority value for each equation of the set of equations according to characteristics of each equation, and selecting an equation of the plurality of equations having a highest placement priority value.

7. A method for programming a programmable logic device to implement a logic function, the programmable logic device including a plurality of function blocks, each function block having an AND array for generating a plurality of product term elements, and a plurality of macrocells, each macrocell having an OR gate programmably connected to the product term elements from the AND array, the method comprising the steps of:

dividing the logic function into a set of equations, each equation including one or more product terms which are mappable into the product term elements of the function block;

selecting an equation from the set of equations;

calculating a weight value for each function block of the plurality of function blocks based on a weighting function having a plurality of variables;

determining whether the selected equation can be assigned to any of the plurality of function blocks;

if the selected equation can be assigned to at least one of the plurality of function blocks, assigning the selected equation to a selected function block based on the calculated weight values;

if the selected equation cannot be assigned to a function block, altering the value assigned to one of the plurality of variables and repeating the steps of selecting and calculating, determining and assigning;

creating a bit map whose contents are defined by the placement arrangement produced after the step of assigning; and transmitting the bit map to the programmable logic device such that the programmable logic device is programmed to implement the logic function in accordance with the bit map.

8. The method according to claim 7, wherein the weight value is directly proportional to a number of function blocks to which output equations have been previously-assigned multiplied by a first variable; and wherein the step of altering the value assigned to one of the plurality of variables includes increasing a value the first variable.

9. The method according to claim 7, wherein the weight value is directly proportional to a number of inputs of each function block assigned to implement previously-assigned equations of the set of equations multiplied by a first variable, a number of product term elements of each function block assigned to implement previously-assigned equations multiplied by a second variable, and a number of outputs of each function block assigned to implement previously-assigned equations multiplied by a third variable, and wherein the step of altering the value assigned to one of the plurality of variables includes increasing a value of one of the first, second and third variables.

10. The method according to claim 7, wherein the step of selecting comprises determining a placement priority value for each equation of the set of equations according to characteristics of each equation, and selecting an equation of the plurality of equations having a highest placement priority value.

11. A method for programming a programmable logic device to implement a logic function, the programmable logic device including a plurality of function blocks, each function block having an AND array for generating a plurality of product term elements, and a plurality of macrocells, each macrocell having an OR gate programmably connected to the product term elements from the AND array, the method comprising the steps of:

dividing the logic function into a set of equations, each equation including one or more product terms which are mappable into the product term elements of the function block;

assigning each equation of the set of equations into the plurality of function blocks such that at least one equation is assigned to each function block;

mapping the equations assigned to each function block to generate a first placement arrangement;

modifying each equation of the set of equations such that a number of product terms associated with at least some of the equations is increased;

mapping the equations assigned to each function block to generate a second placement arrangement;

selecting a preferred placement arrangement from the first and second placement arrangements by determining whether the second placement arrangement is valid, selecting the second placement arrangement if the second placement arrangement is valid, and selecting the first placement arrangement if the second placement arrangement is invalid;

creating a bit map whose contents are defined by the preferred placement arrangement; and transmitting the bit map to the programmable logic device such that the programmable logic device is programmed to implement the logic function in accordance with the bit map.

\* \* \* \* \*